(12) United States Patent
Mitani et al.

(10) Patent No.: US 7,910,957 B2
(45) Date of Patent: Mar. 22, 2011

(54) SEMICONDUCTOR DEVICE

(75) Inventors: Junichi Mitani, Kawasaki (JP); Satoshi Nakai, Kawasaki (JP); Kazushi Fujita, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 17 days.

(21) Appl. No.: 12/342,453

(22) Filed: Dec. 23, 2008

(65) Prior Publication Data

US 2009/0166746 A1  Jul. 2, 2009

(30) Foreign Application Priority Data

Dec. 28, 2007  (JP) ................................. 2007-340631

(51) Int. Cl.
*H01L 23/52* (2006.01)
(52) U.S. Cl. ........ 257/206; 257/365; 257/371; 257/392; 257/407; 257/E29.134; 257/E29.135; 257/E29.136; 257/E21.638
(58) Field of Classification Search .................. 257/365, 257/371, 373, 374, 206, 341, E27.064, E27.07, 257/E27.108, E29.12, E29.134, E29.135, 257/E29.137, E21.632, E21.638, 392, 407, 257/E29.112, E29.136, E21.624, E21.635
See application file for complete search history.

(56) References Cited

U.S. PATENT DOCUMENTS

| 7,335,561 B2 * | 2/2008 | Sakai et al. .................. 438/275 |
| 2004/0238897 A1 * | 12/2004 | Oishi ............................ 257/369 |
| 2005/0189595 A1 | 9/2005 | Okamoto et al. |
| 2006/0027876 A1 * | 2/2006 | Jung et al. .................... 257/369 |
| 2007/0087518 A1 | 4/2007 | Ochi et al. |
| 2008/0020523 A1 * | 1/2008 | Lee et al. ..................... 438/197 |

FOREIGN PATENT DOCUMENTS

| JP | 05-129533 A | 5/1993 |
| JP | 2005-243928 A | 9/2005 |
| JP | 2007-109966 A | 4/2007 |

OTHER PUBLICATIONS

H. Aikawa et al., "Variability Aware Modeling and Characterization in Standard Cell in 45 nm CMOS with Stress Enhancement Technique", Symposium on VLSI Technology Digest of Technical Papers, 2008, pp. 90-91.

* cited by examiner

*Primary Examiner* — Julio J Maldonado
(74) *Attorney, Agent, or Firm* — Westerman, Hattori, Daniels & Adrian, LLP

(57) ABSTRACT

A semiconductor device has a first and a second active regions of a first conductivity type disposed on a semiconductor substrate, a third and a fourth active regions of a second conductivity type disposed on the semiconductor substrate, the second and the fourth active regions having sizes larger than those of the first and the third active regions respectively, a first electroconductive pattern disposed adjacent to the first active region and having a first width, a second electroconductive pattern disposed adjacent to the second active region and having a second width larger than the first width, a third electroconductive pattern disposed adjacent to the third active region and having a third width; and a fourth electroconductive pattern disposed adjacent to the fourth active region and having a fourth width smaller than the third width.

9 Claims, 20 Drawing Sheets

US 7,910,957 B2

SEMICONDUCTOR DEVICE

CROSS-REFERENCE TO RELATED APPLICATION

This application is based upon and claims the benefit of priority of the prior Japanese Patent Application No. 2007-340631 filed on Dec. 28, 2007, the entire contents of which are incorporated herein by reference.

BACKGROUND

1. Field

An aspect of the embodiments discussed herein is directed to a semiconductor device.

2. Description of the Related Art

Semiconductor integrated circuits formed on semiconductor substrates have a device isolation structure called shallow trench isolation (STI), as well as smaller transistors and finer wiring, to increase the packing density.

For example, Japanese Laid-open Patent Publication No. 2007-109966 and No. 2005-243928 discuss semiconductor devices having an STI transistor.

In an STI structure, an insulating layer is embedded in a semiconductor substrate by the following process.

As illustrated in FIG. 30A, a first silicon oxide layer 102 and a silicon nitride layer 103 are sequentially formed on a silicon substrate 101. A resist pattern 104 covering an active region is then formed on the silicon nitride layer 103.

The silicon nitride layer 103, the first silicon oxide layer 102, and the silicon substrate 101 are etched using the resist pattern 104 as a mask. As illustrated in FIG. 30B, after a device isolation trench 105 is formed around the active region of the silicon substrate 101, the resist pattern 104 is removed. A second silicon oxide layer (not illustrated) is then formed on the surface of the device isolation trench 105.

The device isolation trench 105 is entirely filled with a third silicon oxide layer formed by chemical vapor deposition (CVD). As illustrated in FIG. 30C, the third silicon oxide layer on the silicon substrate 101 is removed by chemical mechanical polishing (CMP) using the silicon nitride layer 103 as a polish stop layer. The third silicon oxide layer remaining in the device isolation trench 105 constitutes an STI structure 106. The silicon nitride layer 103 is then selectively removed by wet etching.

As illustrated in FIG. 30D, an N-type MOSFET 111 is formed on the active region of the silicon substrate 101 surrounded by the STI structure 106.

A process for forming the N-type MOSFET 111 includes the operations of forming a P-well 108 in the active region of the silicon substrate 101, forming a gate oxide 109 and a gate electrode 111g on the silicon substrate 101, forming sidewalls 110 on the gate electrode 111g, and forming a source region 111s and a drain region 111d in the silicon substrate 101 by n-type impurity ion implantation before and after the formation of the sidewalls 110.

Although not illustrated in the drawings, another active region is doped with an n-type impurity to form an N-well. A P-type MOSFET is formed in this active region.

In the processes for forming a P-well and an N-well, the application of a resist, impurity ion implantation, and removal of the resist are sequentially performed to define an impurity ion implanted region. A solution to remove the resist also removes part of the STI structure 106. Furthermore, when a sacrificial oxide layer (not illustrated) on the silicon substrate 101 is removed with hydrogen fluoride after the P-well and the N-well are formed, the STI structure 106 is partly removed.

Japanese Laid-open Patent Publication No. 2007-109966 discusses that, when an oxide layer on a silicon substrate is etched with hydrogen fluoride, edges of an active region of the silicon substrate be not exposed, that is, an STI structure be higher than the surface of the silicon substrate.

Since an STI structure is formed of silicon oxide, a difference in thermal expansion coefficient between silicon oxide and a silicon substrate may cause a stress between a device isolation trench and an active region.

This stress affects a channel-forming region under a gate electrode. As illustrated in FIG. 30D, a variation in the distance X between the gate electrode 111g and the STI structure 106, that is, the widths of the source region 111s and the drain region 111d, may result in a variation in a source-drain current running under the gate electrode 111g.

FIG. 2 in Japanese Laid-open Patent Publication No. 2005-243928 discusses that, relative to the on-state current of a MOSFET having a sufficiently long source-drain distance X, the on-state current of a P-type MOSFET gradually increases as the distance X becomes smaller than a predetermined value, and the on-state current of an N-type MOSFET gradually decreases as the distance X becomes smaller than a predetermined value.

An increase in on-state current may result in a decrease in threshold voltage and, in an actual semiconductor circuit, an increase in standby leakage current larger than expected. On the other hand, a decrease in on-state current may result in an increase in threshold voltage and, in an actual semiconductor circuit, an increase in operation delay time larger than expected. In addition, the characteristics of an N-type or P-type MOSFET vary significantly with the source or drain width. This imposes a further restriction in design.

In Japanese Laid-open Patent Publication No. 2005-243928, it is discussed that, in a circuit including a first and second transistors, a distance X between a gate electrode and one end of each of active regions in which the first and second transistors are disposed be constant to prevent variations in on-state current due to variations in distance X. However, in a high-density semiconductor circuit design, it is sometimes desirable to make the distance between a gate electrode and an adjacent device isolation trench constant to equalize the on-state current in all of the MOSFETs constituting a semiconductor integrated circuit. FIG. 18 in Japanese Laid-open Patent Publication No. 5-129533 discusses that the threshold voltage of a P-type MOSFET increases as the distance X becomes larger than a predetermined value.

SUMMARY

According to an aspect of the invention, a semiconductor device has a first and a second active regions of a first conductivity type disposed on a semiconductor substrate, a third and a fourth active regions of a second conductivity type disposed on the semiconductor substrate, the second and the fourth active regions having sizes larger than those of the first and the third active regions respectively, a first electroconductive pattern disposed over the first active region and having a first width, a second electroconductive pattern disposed over the second active region and having a second width larger than the first width, a third electroconductive pattern disposed over the third active region and having a third width; and a fourth electroconductive pattern disposed over the fourth active region and having a fourth width smaller than the third width.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Embodiments will be described in detail with reference to the drawings.

Figure 1:
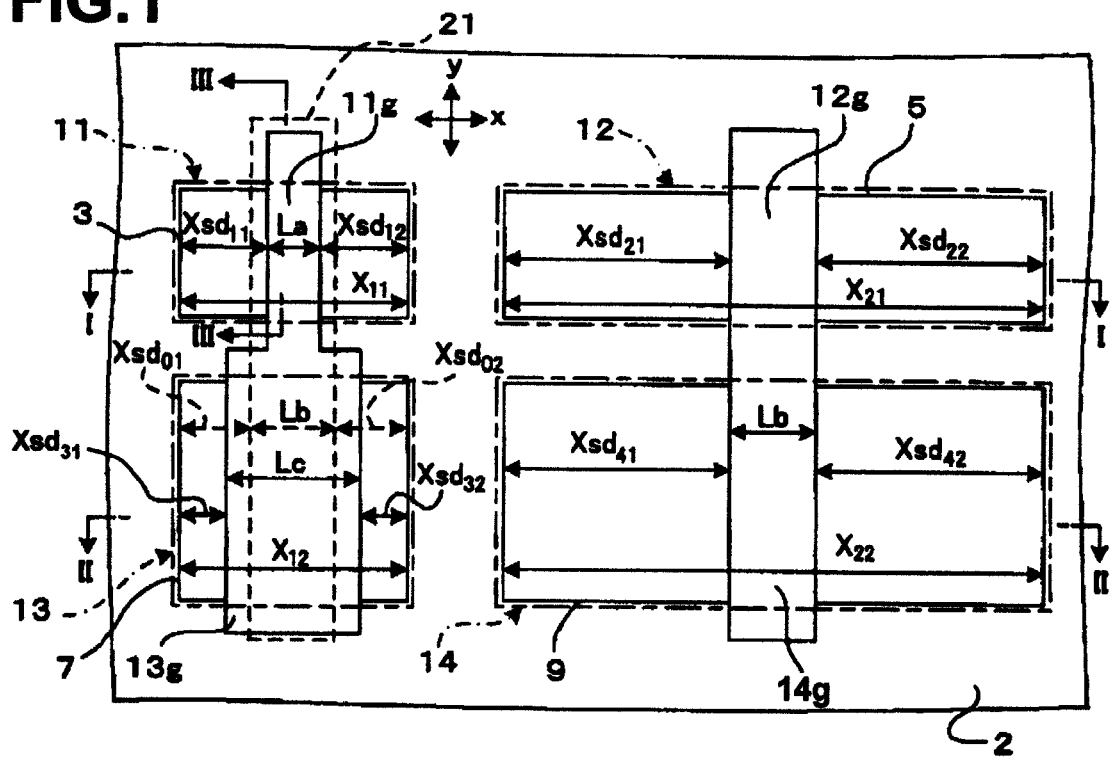
FIG. 1 is a plan view of a semiconductor device according to a first embodiment.
Figure 2A:
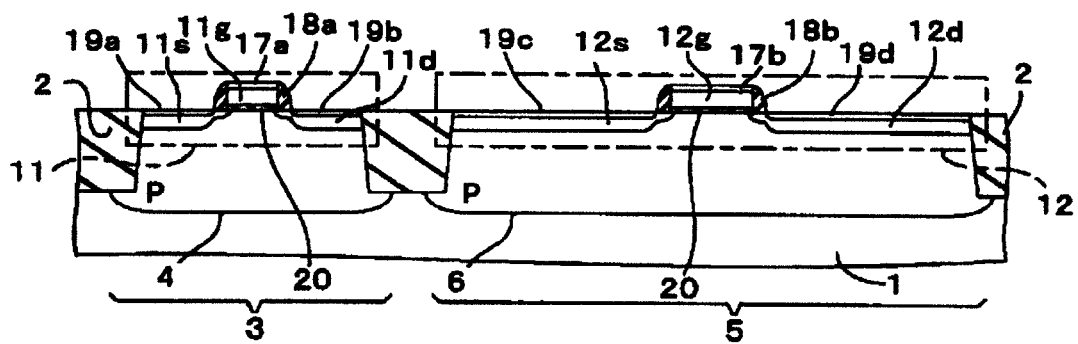
FIGS. 2A and 2B are cross-sectional views of the semiconductor device according to the first embodiment.
Figure 2B:
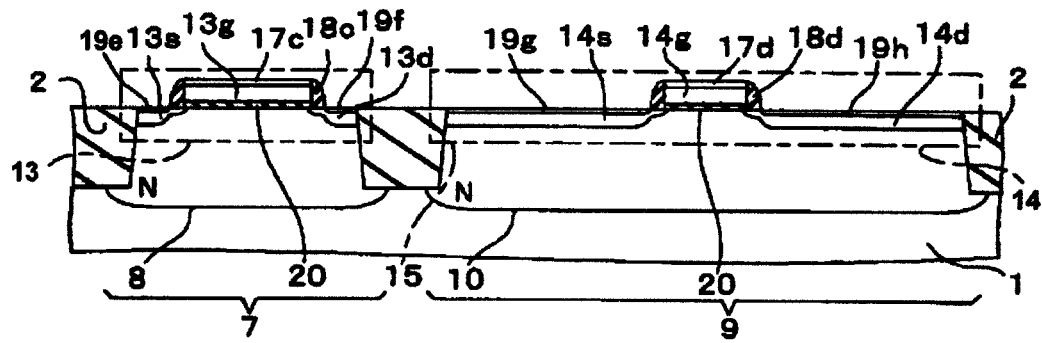

FIG. 1 is a plan view of a semiconductor device according to a first embodiment. FIGS. 2A and 2B are cross-sectional views of the semiconductor device, taken along the lines I-I and II-II in FIG. 1, respectively. The x direction and the y direction in FIG. 1 are orthogonal to each other.

In FIG. 1 and FIGS. 2A and 2B, a silicon (semiconductor) substrate 1 includes a shallow trench isolation (STI) structure 2 surrounding a plurality of active regions. As illustrated in FIG. 2A, a first active region 3 and a second active region 5 of a plurality of active regions surrounded by the STI structure 2 include a first P-well 4 and a second P-well 6, respectively. As illustrated in FIG. 2B, a third active region 7 and a fourth active region 9 includes a first N-well 8 and a second N-well 10, respectively.

The first and second active regions 3 and 5 are p-type active regions, and the third and fourth active regions 7 and 9 are n-type active regions.

The first active region 3 and the third active region 7 are aligned vertically (in the y direction). The lengths $X_{11}$ and $X_{12}$ of these regions in the x direction are identical. The second active region 5 and the fourth active region 9 are aligned vertically (in the y direction). The lengths $X_{21}$ and $X_{22}$ of these regions in the x direction are identical.

The lengths $X_{11}$ and $X_{12}$ of the first and third active regions 3 and 7 are smaller than the lengths $X_{21}$ and $X_{22}$ of the second and fourth active regions 5 and 9.

The first active region 3 and the second active region 5 are aligned horizontally (in the x direction). The lengths of these regions in the y direction are almost identical. The third active region 7 and the fourth active region 9 are aligned horizontally (in the x direction). The lengths of these regions in the y direction are almost identical.

As illustrated in FIG. 2A, in the first active region 3, a first gate electrode 11g and a first and second n-type source/drain regions 11s and 11d constitute a first N-type MOSFET 11. The first gate electrode 11g is disposed on a gate insulating layer 20, which is disposed on the first P-well 4 in the first active region 3. The first and second n-type source/drain regions 11s and 11d are disposed on both sides of the first gate electrode 11g on the first P-well 4.

In the second active region 5, a second gate electrode 12g and a third and fourth n-type source/drain regions 12s and 12d constitute a second N-type MOSFET 12. The second gate electrode 12g is disposed on a gate insulating layer 20, which is disposed on the second P-well 6 in the second active region 5. The third and fourth n-type source/drain regions 12s and 12d are disposed on both sides of the second gate electrode 12g on the second P-well 6.

As illustrated in FIG. 2B, in the third active region 7, a third gate electrode 13g and a first and second p-type source/drain regions 13s and 13d constitute a first P-type MOSFET 13. The third gate electrode 13g is disposed on a gate insulating layer 20, which is disposed on the first N-well 8 in the third active region 7. The first and second p-type source/drain regions 13s and 13d are disposed on both sides of the third gate electrode 13g on the first N-well 8.

In the fourth active region 9, a fourth gate electrode 14g and a third and fourth p-type source/drain regions 14s and 14d constitute a second P-type MOSFET 14. The fourth gate electrode 14g is disposed on a gate insulating layer 20, which is disposed on the second N-well 10 in the fourth active region 9. The third and fourth p-type source/drain regions 14s and 14d are disposed on both sides of the fourth gate electrode 14g on the second N-well 10.

The distance between one side of the first gate electrode 11g and one end of the first active region 3 facing the side in the x direction is hereinafter referred to as "SD width". In the same manner, the term "SD width" is also applied to the gate electrodes 12g, 13g, and 14g in the active regions 5, 7, and 9.

The left and right SD widths in the x direction of the first gate electrode 11g in the first active region 3 are denoted by $Xsd_{11}$ and $Xsd_{12}$, respectively. The left and right SD widths in the x direction of the second gate electrode 12g in the second active region 5 are denoted by $Xsd_{21}$ and $Xsd_{22}$, respectively. The left and right SD widths in the x direction of the third gate electrode 13g in the third active region 7 are denoted by $Xsd_{31}$ and $Xsd_{32}$, respectively. The left and right SD widths in the x direction of the fourth gate electrode 14g in the fourth active region 9 are denoted by $Xsd_{41}$ and $Xsd_{42}$, respectively.

In the silicon substrate 1 illustrated in FIG. 1, the left and right SD widths in the first active region 3 are identical, that is, $Xsd_{11}=Xsd_{12}$. Likewise, the left and right SD widths in the second, third, and fourth active regions 5, 7, and 8 are identical, that is, $Xsd_{21}=Xsd_{22}$, $Xsd_{31}=Xsd_{32}$, and $Xsd_{41}=Xsd_{42}$.

The SD widths $Xsd_{21}$, $Xsd_{22}$, $Xsd_{41}$, and $Xsd_{42}$ in the second and fourth active regions 5 and 9 are larger than the SD widths $Xsd_{11}$, $Xsd_{12}$, $Xsd_{31}$, and $Xsd_{32}$ in the first and third active regions 3 and 7. The SD widths $Xsd_{31}$ and $Xsd_{32}$ in the third active region 7 are smaller than the SD widths $Xsd_{11}$ and $Xsd_{12}$ in the first active region 3.

The first to fourth n-type source/drain regions 11s, 11d, 12s, and 12d are formed in the same operation and have substantially the same impurity concentration profile in the depth direction. The first to fourth p-type source/drain regions 13s, 13d, 14s, and 14d are formed in the same operation and have substantially the same impurity concentration profile in the depth direction.

The first to fourth gate electrodes 11g, 12g, 13g, and 14g may be formed of an impurity-doped polysilicon film. Metal silicide layers 17a to 17d are disposed on the first to fourth gate electrodes 11g to 14g. The first to fourth gate electrodes 11g, 12g, 13g, and 14g have sidewalls 18a to 18d. In the n-type source/drain regions 11s, 11d, 12s, and 12d and the p-type source/drain regions 13s, 13d, 14s, and 14d, metal silicide layers 19a to 19h are formed in regions covered with neither the first to fourth gate electrodes 11g, 12g, 13g, and 14g nor the sidewalls 18a to 18d. The metal silicide layers 17a to 17d and 19a to 19h may be formed of nickel silicide or cobalt silicide.

The first gate electrode 11g in the first active region 3 is electrically connected to the third gate electrode 13g in the third active region 7. The second gate electrode 12g in the second active region 5 is electrically connected to the fourth gate electrode 14g in the fourth active region 9.

The width in the x direction, that is, the gate length of the second gate electrode 12g is identical to that of the fourth gate electrode 14g. The width in the x direction, that is, the gate length $L_a$ of the first gate electrode 11g is smaller than the width in the x direction, that is, the gate length $L_c$ of the third gate electrode 13g.

The gate length $L_b$ of the second and fourth gate electrodes 12g and 14g is larger than the gate length $L_a$ of the first gate electrode 11g and is smaller than the gate length $L_c$ of the third gate electrode 13g, that is, $L_c > L_b > L_a$.

The following is the reason for this relationship.

The gate electrodes in a plurality of N-type MOSFETs that are designed to have the same transistor characteristics have the same design gate length. However, a variation in SD width in an active region results in a variation in on-state current. The same applies to P-type MOSFETs.

The present inventor found that variations in the transistor characteristics of the first and second N-type MOSFETs 11 and 12 may be reduced or prevented by making the gate length of the first gate electrode 11g smaller than the gate length of the second gate electrode 12g in an actual device.

The present inventor also found that variations in the transistor characteristics of the first and second P-type MOSFETs 13 and 14 may be reduced or prevented by making the gate length of the third gate electrode 13g larger than the gate length of the fourth gate electrode 14g in an actual device.

A method for modifying the design pattern width, that is, the design gate length of a gate electrode is described below.

The first to fourth gate electrodes 11g, 12g, 13g, and 14g are formed of, for example, a doped polysilicon film. The polysilicon film is patterned to have the above-mentioned gate length by photolithography. In place of the doped polysilicon film, a nondoped polysilicon film may be doped with a p-type or n-type impurity by ion implantation to form an electroconductive film. Alternatively, amorphous silicon may be deposited and heat-treated to form polysilicon.

In photolithography, a photoresist applied to a polysilicon film is exposed and developed to form a resist pattern, and the polysilicon film is then etched using the resist pattern as a mask.

The photoresist is exposed to light passing through an exposure mask. The exposure mask for use in the formation of a gate electrode is produced by the following process.

Figure 3:
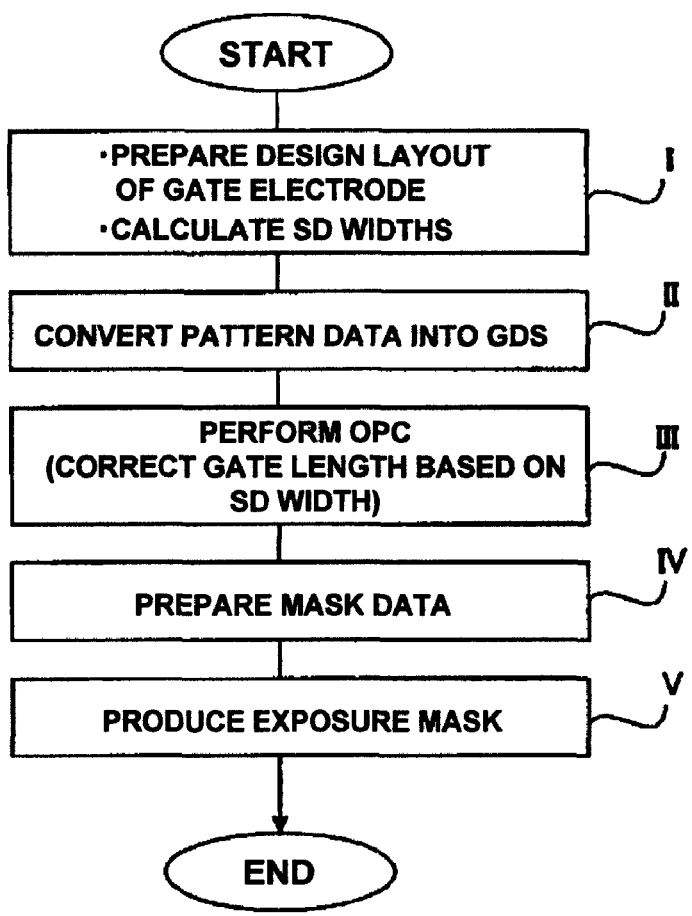
FIG. 3 is a flow chart of design data on a semiconductor device according to an embodiment.

First, as illustrated in operation I in FIG. 3, a design layout of gate electrodes is prepared.

In the design layout, the sizes and positions of active regions, as well as the gate lengths and the gate widths (lengths in the y direction) of the gate electrodes, are designed. As indicated by the broken line in FIG. 1, the first gate electrode 11g in the first active region 3 and the third gate electrode 13g in the third active region 7 are designed as a gate electrode 21 having the same gate length $L_b$ as the second and fourth gate electrodes 12g and 14g.

In the design layout, the gate length of the gate electrode 21 in the first active region 3 and the third active region 7 has the same gate length $L_b$ as the second and fourth gate electrodes 12g and 14g.

In the design layout, the SD widths are calculated from data on the first to fourth active regions 3, 5, 7, and 9 and the first to fourth gate electrodes 11g, 12g, 13g, and 14g. In the design layout of the semiconductor device illustrated in FIG. 1, the left and right design SD widths $Xsd_{01}$ and $Xsd_{02}$ of the gate electrode 21 in the first active region 3 and the third active region 7 are identical to each other and are smaller than the SD widths $Xsd_{21}$, $Xsd_{22}$, $Xsd_{41}$, and $Xsd_{42}$ in the second active region 5 and the fourth active region 9.

Such pattern data in the design layout are converted into GDS, as illustrated in operation II in FIG. 3. The GDS is a binary file that defines information, such as the shape and the coordinates, required to produce an exposure mask, and is a format for defining the layout data of a semiconductor integrated circuit.

As illustrated in operation III, optical proximity correction (OPC) is performed. In the OPC, a mask pattern is corrected with an optical proximity effect taken into account to cancel a difference between the mask pattern and an actual pattern due to a light diffraction effect. In the present embodiment, correction based on the SD width is also performed. As illustrated in operations IV and V, mask data is prepared, and a light-shielding film on a quartz substrate is patterned on the basis of the mask data to produce an exposure mask for use in the formation of a gate electrode.

After the OPC without using the SD width as a parameter, the first gate electrode 11g and the third gate electrode 13g have the design shape of the gate electrode 21. Thus, the gate length of the first gate electrode 11g and the third gate electrode 13g is the same as the gate length $L_b$ of the second and fourth gate electrodes 12g and 14g.

An exposure mask is produced by correcting design data without using the SD width as a parameter in the OPC of a gate electrode. When an N-type MOSFET is formed in the first active region 3 using the exposure mask, the relationship between the design SD width $Xsd_{01}$ of the N-type MOSFET and the on-state current Ion is indicated by the broken line in FIG. 4. When a P-type MOSFET is formed in the third active region 7 using the exposure mask, the relationship between the design SD width $Xsd_{01}$ of the P-type MOSFET and the on-state current Ion is indicated by the broken line in FIG. 5.

Figure 4:
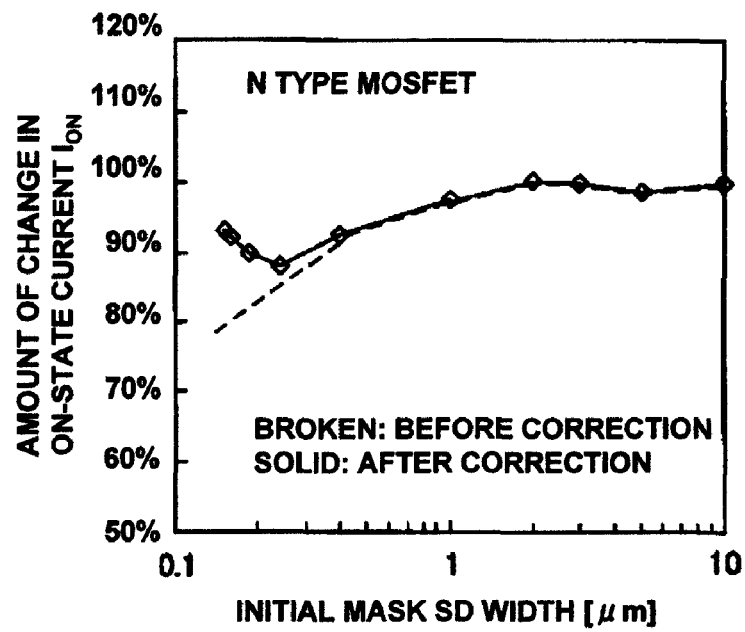
FIG. 4 is a graph illustrating the relationship between the SD width and the on-state current of an N-type MOSFET in the semiconductor device according to the first embodiment.
Figure 5:
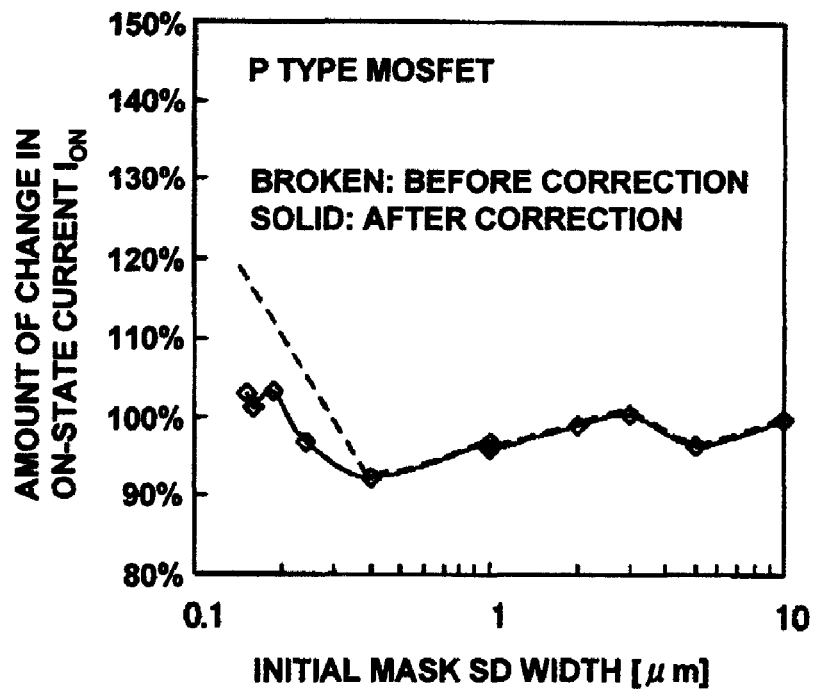
FIG. 5 is a graph illustrating the relationship between the SD width and the on-state current of a P-type MOSFET in the semiconductor device according to the first embodiment.

In the MOSFETs having the characteristics as illustrated in FIGS. 4 and 5, the gate length of the gate electrode 21 may be about 60 nm, and the gate width in the y direction may be about 1.0 μm.

As illustrated by the broken line in FIG. 4, the decrease in the on-state current Ion of the N-type MOSFET increases as the SD width $Xsd_{01}$ decreases from about 0.4 μm. This causes a variation in threshold voltage or operation delay time.

As illustrated by the broken line in FIG. 5, the increase in the on-state current Ion increases as the SD width $Xsd_{01}$ decreases from about 0.4 μm. This causes an increase in standby leakage current and a decrease in threshold voltage.

Thus, even when a plurality of P-type MOSFETs and N-type MOSFETs are formed on the same semiconductor substrate under the same conditions, if the gate lengths are not corrected on the basis of the SD width data, variations in the transistor characteristics of the P-type MOSFETs or the N-type MOSFETs increase.

To reduce the difference in transistor characteristics between a plurality of MOSFETs, the present inventor found that variations in on-state current may be reduced by correcting the design gate length. More specifically, when the SD width is smaller than a predetermined value, the gate length of the gate electrode in an N-type MOSFET may be reduced from the design value to reduce or prevent a decrease in on-state current. Furthermore, when the SD width is smaller than a predetermined value, the gate length of the gate electrode in a P-type MOSFET may be increased from the design value to reduce or prevent an increase in on-state current.

Figure 6:
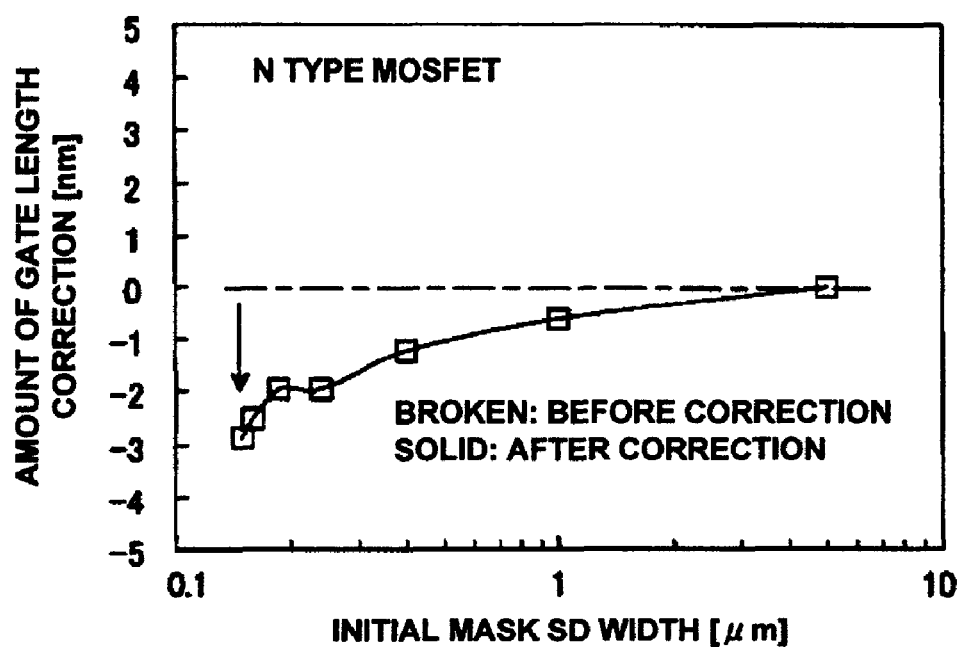
FIG. 6 is a graph illustrating the relationship between the SD width and the gate length correction of an N-type MOSFET in the semiconductor device according to the first embodiment.

Thus, as illustrated in FIG. 6, when the gate length of an N-type MOSFET was reduced from a design value $L_b$ as the design SD width decreases from a predetermined value, a decrease in on-state current was prevented, as illustrated by the solid line in FIG. 4.

Figure 7:
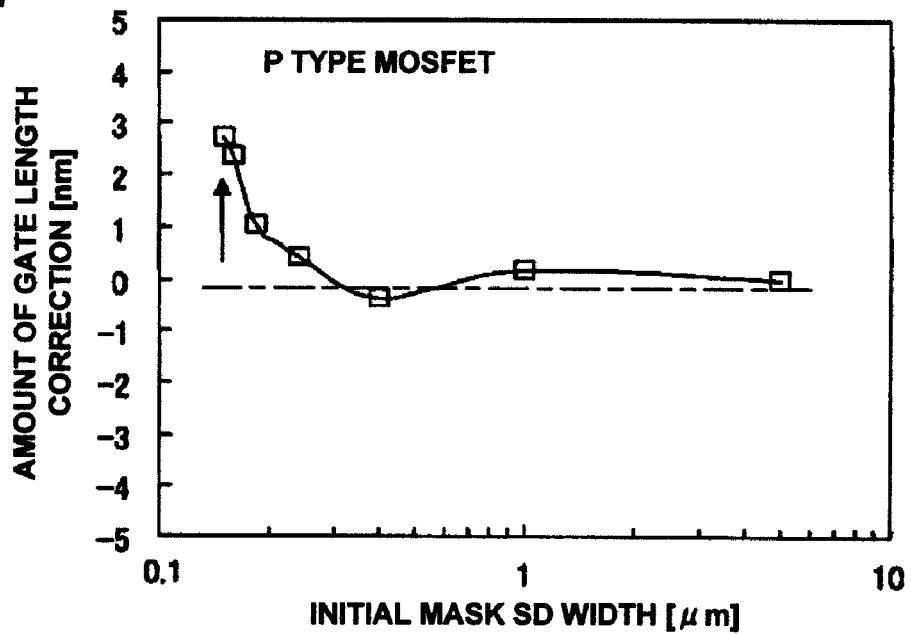
FIG. 7 is a graph illustrating the relationship between the SD width and the gate length correction of a P-type MOSFET in the semiconductor device according to the first embodiment.

As illustrated in FIG. 7, when the gate length of a P-type MOSFET was increased from a design value $L_b$ as the design SD width decreases from a predetermined value, an increase in on-state current was prevented, as illustrated by the solid line in FIG. 5.

The vertical axes in FIGS. 6 and 7 represent the gate length correction (deviation) relative to the gate length of a MOSFET having such an SD width that the on-state current of the MOSFET is held constant. A sufficiently large SD width may be 5 μm, and the design gate length may be about 60 nm.

Thus, in a plurality of N-type MOSFETs having different SD widths, the gate length of an N-type MOSFET having an SD width of not more than a predetermined value may be corrected to be smaller than a design value in the preparation of exposure mask data to reduce the difference in transistor characteristics. In a plurality of P-type MOSFETs having different SD widths, the gate length of a P-type MOSFET having an SD width of not more than a predetermined value may be corrected to be larger than a design value in the preparation of exposure mask data to reduce the difference in transistor characteristics.

In an N-type MOSFET, a gate length smaller than a design value results in an SD width larger than a design value. However, the gate length is not reduced in order to adjust the SD width of the N-type MOSFET to the SD width of another N-type MOSFET and thereby equalize the transistor characteristics. The gate length is reduced because the characteristics of the N-type MOSFET change with the gate length.

In the first active region 3 in FIG. 1, the left SD width $Xsd_{11}$ is identical to the right SD width $Xsd_{12}$. If these SD widths are different, the gate length is altered on the basis of a smaller design SD width. The same applies to the third active region 7.

The gate length may be modified as follows:

In one active region, when a right or left design SD width of a gate electrode is 0.17 μm or less (SD width≦0.17 μm), the lengths of a right and left halves of the gate electrode in a P-type MOSFET are individually increased by 1.5 nm (3.0 nm in total) from the design value by the correction of mask data. Concurrently, the lengths of a right and left halves of the gate electrode in an N-type MOSFET are individually reduced by 1.5 nm (3.0 nm in total) from the design value.

In one active region, when a right and left design SD widths of a gate electrode are more than 0.17 μm and at least one of the SD widths is not more than 0.20 μm (0.20 μm≧SD width>0.17 μm), the lengths of a right and left halves of the gate electrode in a P-type MOSFET are individually increased by 1.0 nm (2.0 nm in total) from the design value by the correction of mask data. Concurrently, the lengths of a right and left halves of the gate electrode in an N-type MOSFET are individually reduced by 1.0 nm (2.0 nm in total) from the design value by the correction of mask data.

In one active region, when a right and left design SD widths of a gate electrode are more than 0.20 μm and at least one of the SD widths is not more than 0.23 μm (0.23 μm≧SD width>0.20 μm), the lengths of a right and left halves of the gate electrode in a P-type MOSFET are individually increased by 0.5 nm (1.0 nm in total) from the design value by the correction of mask data. Concurrently, the lengths of a right and left halves of the gate electrode in an N-type MOSFET are individually reduced by 0.5 nm (1.0 nm in total) from the design value by the correction of mask data.

In one active region, when a right and left design SD widths of a gate electrode are more than 0.23 μm and at least one of the SD widths is not more than 0.30 μm (0.30 μm≧SD width>0.23 μm), the lengths of a right and left halves of the gate electrode in a P-type MOSFET are individually increased by 0.25 nm (0.50 nm in total) from the design value by the correction of mask data. Concurrently, the lengths of a right and left halves of the gate electrode in an N-type MOSFET are individually reduced by 0.25 nm (0.5 nm in total) from the design value by the correction of mask data.

A right and left SD widths in one active region are not necessarily identical in a design layout.

Figure 8:
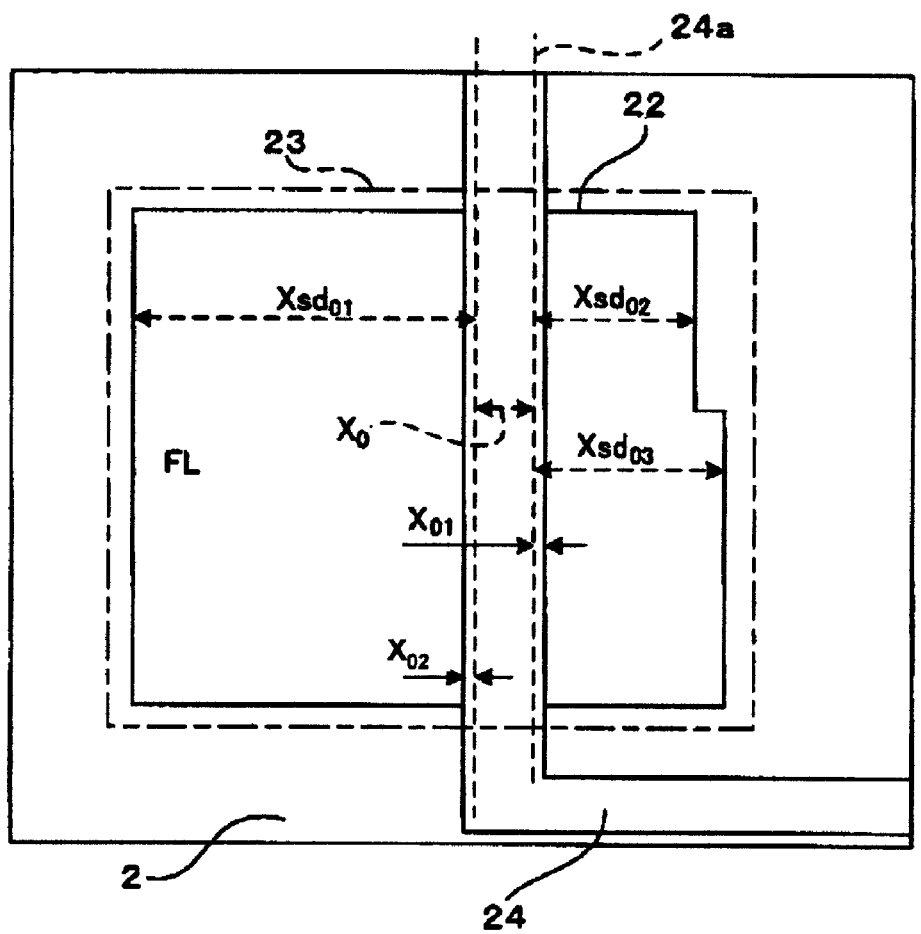
FIG. 8 is a plan view illustrating an exemplary gate length correction of a P-type MOSFET in the semiconductor device according to the first embodiment.

For example, as illustrated in FIG. 8, in a design gate electrode 24a indicated by the broken line in a P-type MOSFET 23 formed in an active region 22, a left design SD width $Xsd_{01}$ is larger than right design SD widths $Xsd_{02}$ and $Xsd_{03}$, which are not identical. More specifically, the left design SD width $Xsd_{01}$ is 0.4 μm, and the right design SD widths $Xsd_{02}$ and $Xsd_{03}$ are 0.16 and 0.18 μm, respectively.

In this case, the gate length is preferably altered on the basis of the smallest design SD width $Xsd_{02}$. More specifically, as illustrated in FIG. 7, additional left and right pattern widths $X_{01}$ and $X_{02}$ of 0.0015 μm (0.0030 μm in total) are added to a design gate length $X_0$.

As indicated by the solid line in FIG. 5, variations in the on-state current of the P-type MOSFET 23 including the gate electrode 24 thus formed are reduced to not more than 10% of variations observed before correction. This may reduce the difference in on-state current between the P-type MOSFET 23 and another P-type MOSFET having a sufficiently large SD width.

Preferably, a variation in on-state current due to the gate length correction is not more than 10% or 15% of the on-state current of a MOSFET having a sufficiently large SD width. In the N-type MOSFET and the P-type MOSFET illustrated in FIGS. 4 and 5, the gate length correction may reduce variations in on-state current to not more than 20% or 10% of variations observed before the correction.

In the above-mentioned embodiment, the gate length of the N-type MOSFET is reduced, and the gate length of the P-type MOSFET is increased. However, depending on the structure of a semiconductor integrated circuit, the gate length of either a P-type MOSFET or an N-type MOSFET may be altered. A choice between a P-type MOSFET or an N-type MOSFET may be made on the basis of whether the reduction in transistor delay time or the prevention of standby leakage is important.

The length and the width described above are target values in the silicon substrate 1. The same applies to the following embodiments.

A method for forming the above-mentioned semiconductor device will be described below with reference to FIGS. 9A to 9G, FIGS. 10A to 10D, and FIGS. 11A to 11D. FIGS. 9A to 9G are cross-sectional views of the gate electrode 11g in the N-type MOSFET 11, taken along the line III-III in FIG. 1. FIGS. 10A to 10D and FIGS. 11A to 11D are cross-sectional views taken along the lines I-I and II-II in FIG. 1, respectively.

Figure 9A:
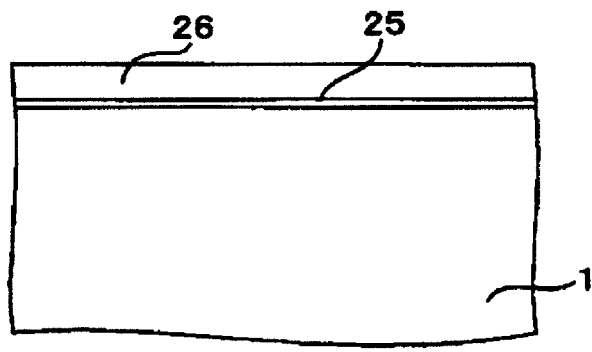
FIGS. 9A-9D are cross-sectional views (part 1) illustrating a process for forming the semiconductor device according to the first embodiment.

First, as illustrated in FIG. 9A, a silicon dioxide ($SiO_2$) layer 25 having a thickness of about 10 nm is formed on the silicon substrate 1 by thermal oxidation or CVD. A silicon nitride ($Si_3N_4$) layer 26 having a thickness of 100 nm is formed on the $SiO_2$ layer 25 by CVD.

A photoresist is applied to the $Si_3N_4$ layer 26 and is exposed and developed to form a resist pattern 27, which covers the first to fourth active regions 3, 5, 7, and 9 except a device isolation region.

Figure 9B:
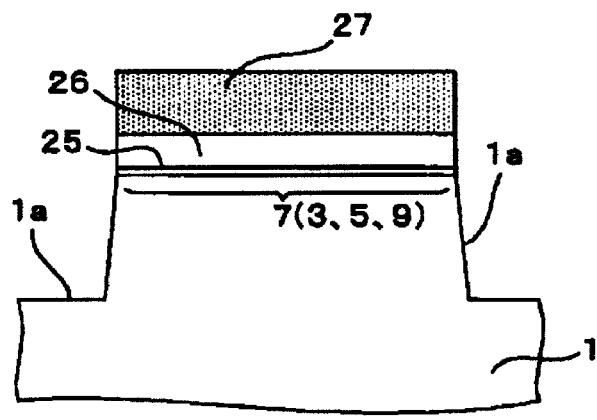

As illustrated in FIG. 9B, the $Si_3N_4$ layer 26 and the $SiO_2$ layer 25 are removed by reactive ion etching (RIE) using the resist pattern 27 as a mask, and the silicon substrate 1 is etched to form a trench 1a having a depth of about 300 nm.

Figure 9C:
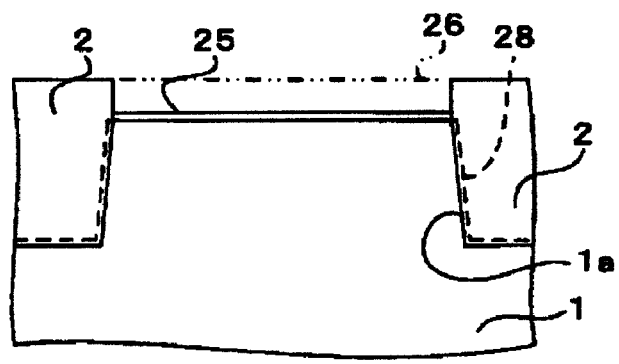

As illustrated in FIG. 9C, after the resist pattern 27 is removed, an STI structure 2 is formed in the trench 1a. The STI structure 2 is formed by the following process.

First, a $SiO_2$ layer 28 having a thickness of 3 nm is formed on the surface of the trench 1a by thermal oxidation. A $SiO_2$ layer is formed on the $Si_3N_4$ layer 26 and in the trench 1a by high-density plasma CVD. The $SiO_2$ layer has such a thickness that the trench 1a is entirely filled therewith, for example, 500 nm as measured on the $Si_3N_4$ layer 26.

The $SiO_2$ layer formed on the $Si_3N_4$ layer 26 is selectively removed by chemical mechanical polishing (CMP) using the $Si_3N_4$ layer 26 as a polish stop layer. Part of the $Si_3N_4$ layer 26 is removed by the CMP. The $SiO_2$ layer remaining in the trench 1a in the device isolation region forms the STI structure 2. The surface of the STI structure 2 is flush with the surface of the $Si_3N_4$ layer 26.

After the CMP, the $SiO_2$ layer of the STI structure 2 is annealed for densification in a furnace at 900° C. for 30 minutes. The $Si_3N_4$ layer 26 is then removed by phosphoric acid boiling.

The STI structure 2 protrudes by about 100 nm from the surface of the silicon substrate 1.

Figure 9D:
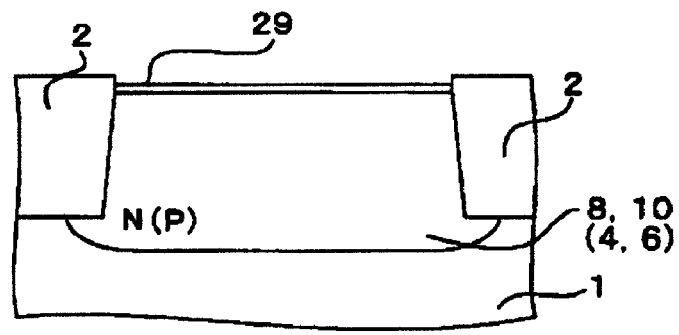

As illustrated in FIG. 9D, after the $SiO_2$ layer 25 is removed with hydrogen fluoride, a sacrificial oxide layer 29 having a thickness of 10 nm is formed on the silicon substrate 1 in the third active region 7 by thermal oxidation.

While the $SiO_2$ layer 25 is removed, the $SiO_2$ layer of the STI structure 2 is slightly etched with hydrogen fluoride. This reduces the protrusion height of the STI structure 2.

The first and second active regions 3 and 5 are doped with a p-type impurity, such as boron (B), by ion implantation to form P-wells 4 and 6, respectively. The third and fourth active regions 7 and 9 are doped with an n-type impurity, such as phosphorus or arsenic, by ion implantation to form N-wells 8 and 10, respectively.

The first to fourth active regions 3, 5, 7, and 9 are then doped with an n-type or p-type impurity by ion implantation to control the threshold of the MOSFETs.

In the ion implantation of an n-type or p-type impurity, a nontarget area is covered with a photoresist. Thus, in the ion implantation, patterning of a photoresist, ion implantation, and removal of the photoresist are repeatedly performed.

While the photoresist is removed with an ammonia-hydrogen peroxide solution (APM), the $SiO_2$ layer of the STI structure 2 is slightly etched. This reduces the protrusion height of the STI structure 2.

Figure 9E:
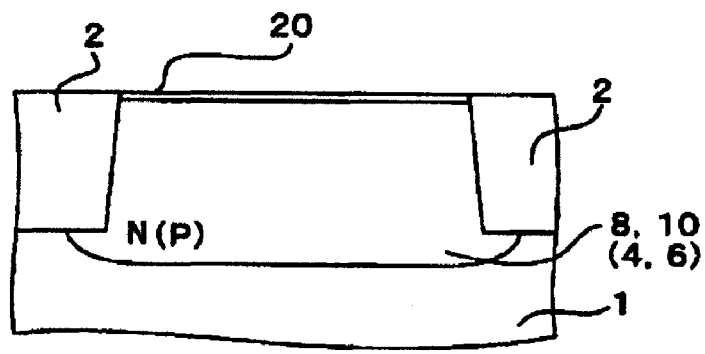
FIGS. 9E-9G are cross-sectional views (part 2) illustrating a process for forming the semiconductor device according to the first embodiment.

As illustrated in FIG. 9E, after the sacrificial oxide layer 29 is removed with hydrogen fluoride, a gate oxide (gate insulating layer) 20 having a thickness of 2 nm is formed on the silicon substrate 1 in the first to fourth active regions 3, 5, 7, and 9 by thermal oxidation or CVD.

Figure 10A:
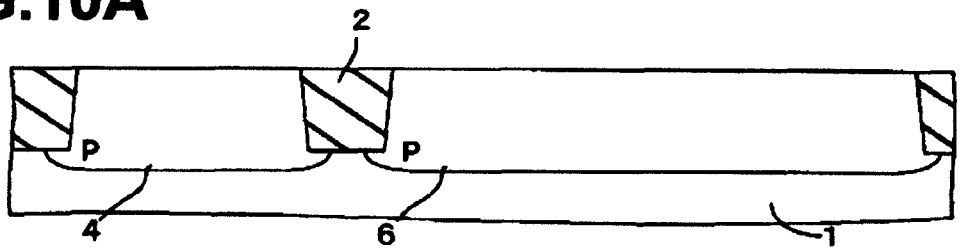
FIGS. 10A-10D are cross-sectional views illustrating a process for forming an N-type MOSFET in the semiconductor device according to the first embodiment.
Figure 11A:
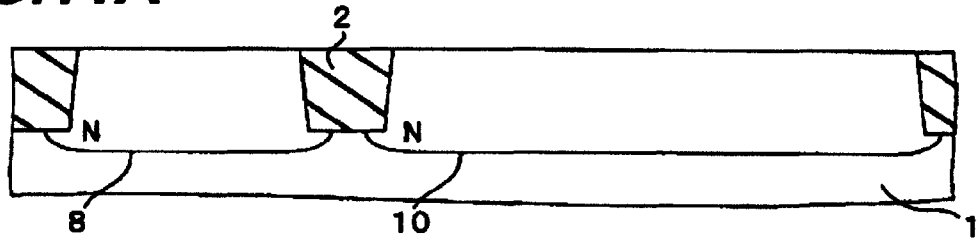
FIGS. 11A-11D are cross-sectional views illustrating a process for forming a P-type MOSFET in the semiconductor device according to the first embodiment.

While the sacrificial oxide layer 29 is removed with hydrogen fluoride, the $SiO_2$ layer of the STI structure 2 is also etched slightly. This further reduces the protrusion height of the STI structure 2. Consequently, as illustrated in FIGS. 10A and 11A, the surface of the STI structure 2 is almost flush with the surface of the silicon substrate 1 within ±5 nm.

The process for forming an STI structure described above is provided for illustration only. The present technique may also be applied to another process for forming an STI structure.

Figure 9F:
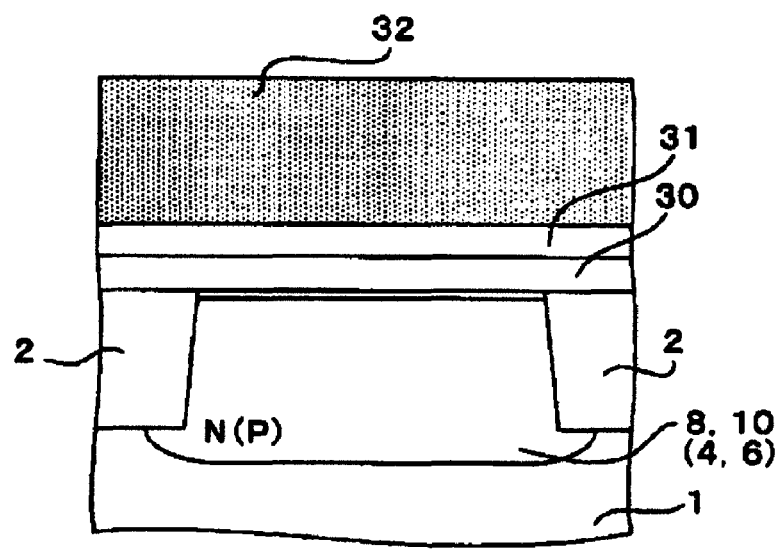

As illustrated in FIG. 9F, a polysilicon layer 30 having a thickness of 105 nm is formed on the gate oxide 20 by CVD. A bottom anti-reflection coating (BARC) layer 31 having a thickness of 75 nm and a photoresist layer 32 are formed on the polysilicon layer 30. The polysilicon layer 30 is doped with a p-type or n-type impurity by ion implantation to form an electroconductive layer.

The impurity ion implantation may be performed immediately after the formation of the polysilicon layer 30. Alternatively, the impurity ion implantation may be performed simultaneously with impurity ion implantation in the formation of an n-type source/drain region illustrated in FIG. 10D or a p-type source/drain region illustrated in FIG. 11D.

The BARC layer 31 reduces a standing wave effect in the photoresist layer 32 during the exposure of the photoresist layer 32.

The photoresist layer 32 is exposed and developed to form a gate electrode pattern. An exposure mask or reticle produced according to the flow chart illustrated in FIG. 3 is used in the exposure.

The BARC layer 31 and the polysilicon layer 30 are etched using the photoresist pattern as a mask. The resulting electroconductive patterns in the first to fourth active regions 3, 5, 7, and 9 are used as the first to fourth gate electrodes 11g, 12g, 13g, and 14g.

Figure 9G:
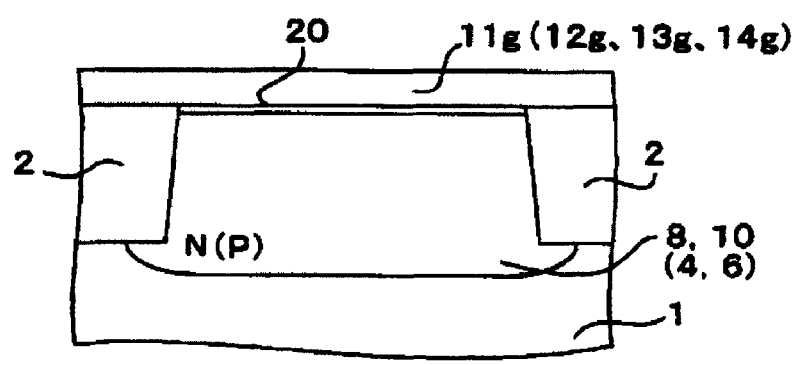
Figure 10B:
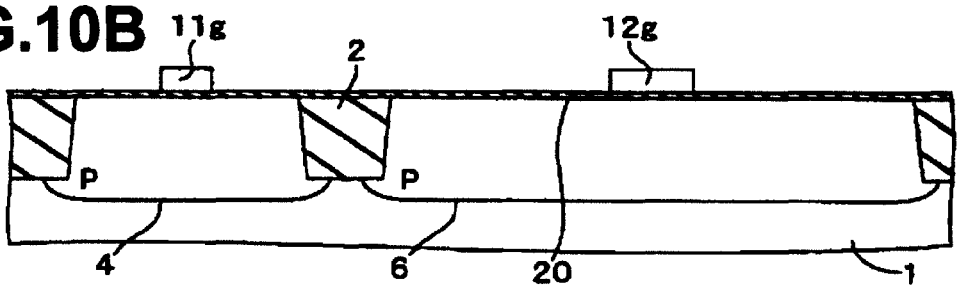
Figure 11B:
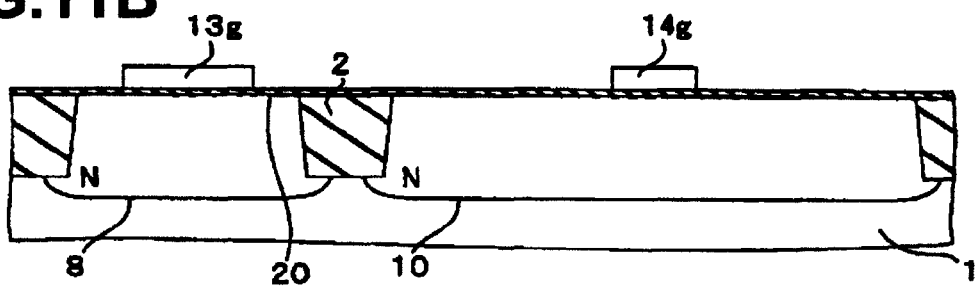

As illustrated in FIG. 9G, the photoresist layer 32 and the BARC layer 31 are then removed. As illustrated in FIGS. 10B and 11B, the first to fourth gate electrodes 11g, 12g, 13g, and 14g are exposed.

After part of the gate oxide 20 not covered with the first to fourth gate electrodes 11g, 12g, 13g, and 14g are removed, a sacrificial oxide layer 29a is formed on the silicon substrate 1 by thermal oxidation.

Figure 10C:
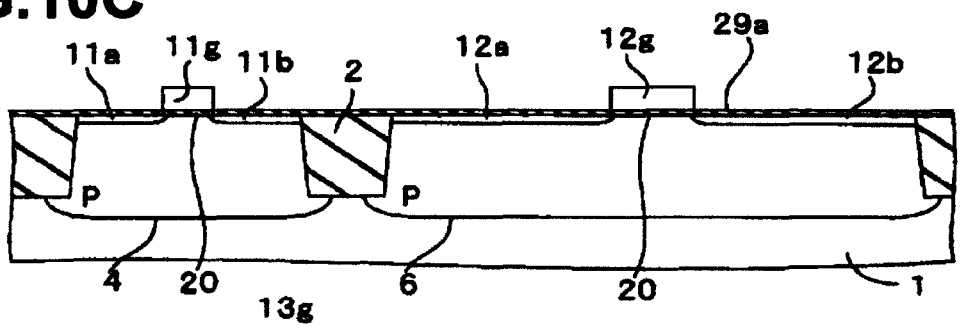

As illustrated in FIG. 10C, while the third and fourth active regions 7 and 9 are covered with a photoresist (not illustrated), the P-wells 4 and 6 in the first and second active regions 3 and 5 are doped with an n-type impurity by ion implantation to form n-type extension regions 11a, 11b, 12a, and 12b on both sides of the first and second gate electrodes 11g and 12g. The photoresist on the third and fourth active regions 7 and 9 are then removed.

Figure 11C:
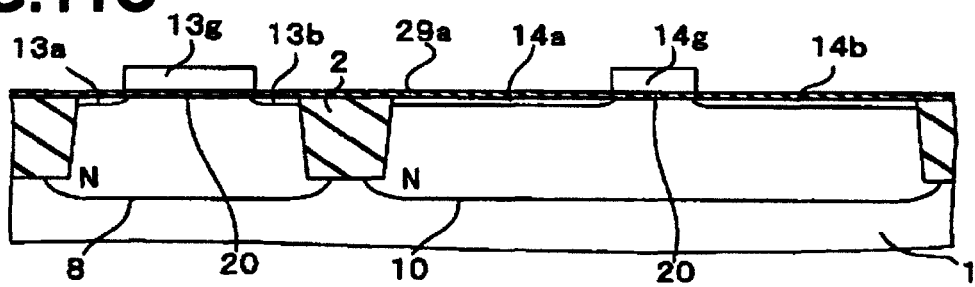

As illustrated in FIG. 11C, while the first and second active regions 3 and 5 are covered with a photoresist (not illustrated), the N-wells 8 and 10 in the third and fourth active regions 7 and 9 are doped with a p-type impurity by ion implantation to form p-type extension regions 13a, 13b, 14a, and 14b on both sides of the third and fourth gate electrodes 13g and 14g. The photoresist on the first and second active regions 3 and 5 are then removed.

After a silicon oxide layer is formed over the entire surface of the silicon substrate 1 by CVD, the silicon oxide layer is etched back to form sidewalls 18a, 18b, 18c, and 18d of the first to fourth gate electrodes 11g, 12g, 13g, and 14g, respectively.

Figure 10D:
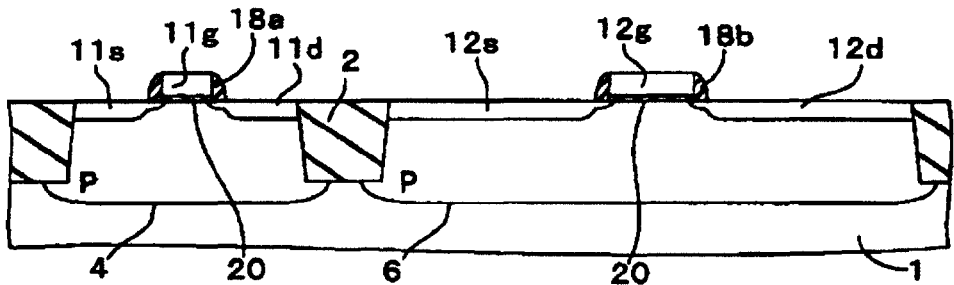

As illustrated in FIG. 10D, while the third and fourth active regions 7 and 9 are covered with a photoresist (not illustrated), the n-type extension regions 11a, 11b, 12a, and 12b are doped with an n-type impurity by ion implantation using the first and third gate electrodes 11g and 12g and the sidewalls 18a and 18b as masks to form n-type source/drain regions 11s, 11d, 12s, and 12d. The photoresist on the third and fourth active regions 7 and 9 are then removed.

Figure 11D:
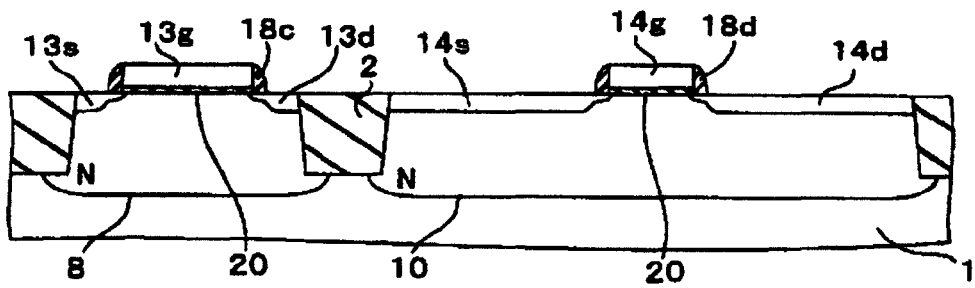

As illustrated in FIG. 11D, while the first and second active regions 3 and 5 are covered with a photoresist (not illustrated), the p-type extension regions 13a, 13b, 14a, and 14b are doped with a p-type impurity by ion implantation using the third and fourth gate electrodes 13g and 14g and the sidewalls 18c and 18d as masks to form p-type source/drain regions 13s, 13d, 14s, and 14d. The photoresist on the first and second active regions 3 and 5 are then removed.

Metal silicide layers 17a to 17d and 19a to 19h are formed on the first to fourth gate electrodes 11g, 12g, 13g, and 14g, the n-type source/drain regions 11s, 11d, 12s, and 12d, and the p-type source/drain regions 13s, 13d, 14s, and 14d. Through these operations, the first and second N-type MOSFETs 11 and 12 illustrated in FIG. 2A and the first and second P-type MOSFETs 13 and 14 illustrated in FIG. 2B are formed.

The process for forming a MOSFET described above is provided for illustration only. The present technique may also be applied to another process for forming a MOSFET. For example, the sacrificial oxide layer 29a may be omitted.

While not illustrated, an interlayer insulating layer is formed on the first and second N-type MOSFETs 11 and 12 and the first and second P-type MOSFETs 13 and 14, and an electroconductive plug is formed.

Thus, nonuniform transistor characteristics of a plurality of N-type MOSFETs and a plurality of P-type MOSFETs may be modified by altering the gate lengths on the basis of the difference in SD width in the active regions surrounded by the STI structure. More specifically, the gate length of an N-type MOSFET having a narrow source/drain region may be reduced to prevent a decrease in on-state current. The gate length of a P-type MOSFET having a narrow source/drain region may be increased to prevent an increase in on-state current.

Figure 12:
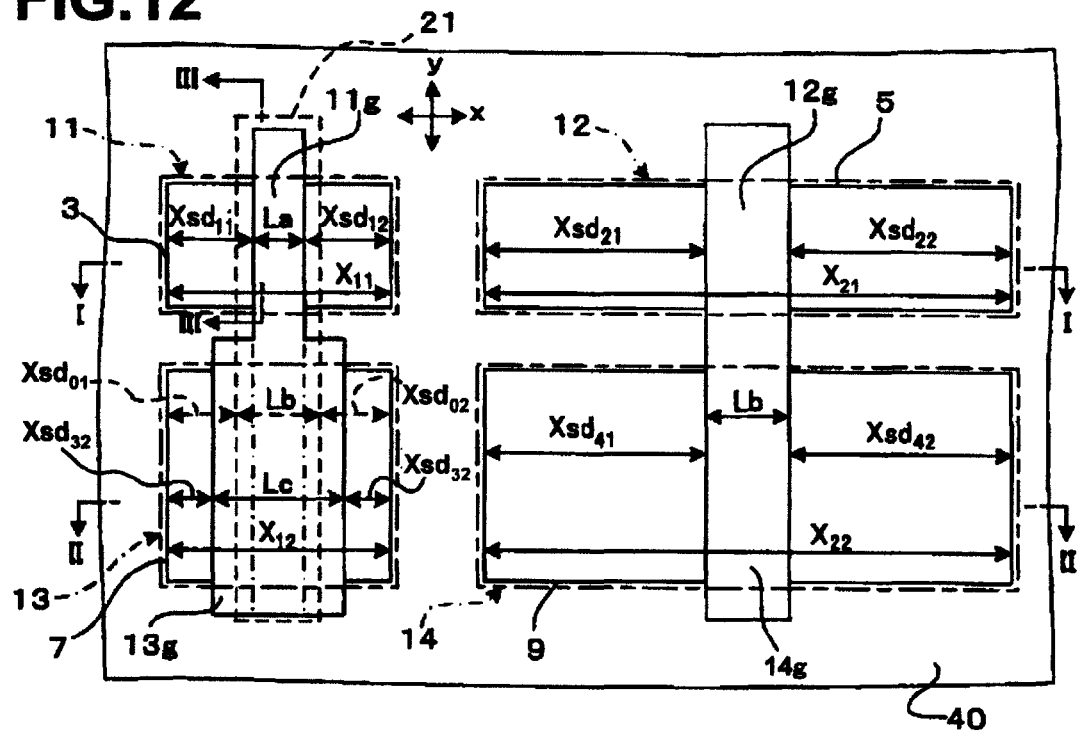
FIG. 12 is a plan view of a semiconductor device according to a second embodiment.
Figure 13A:
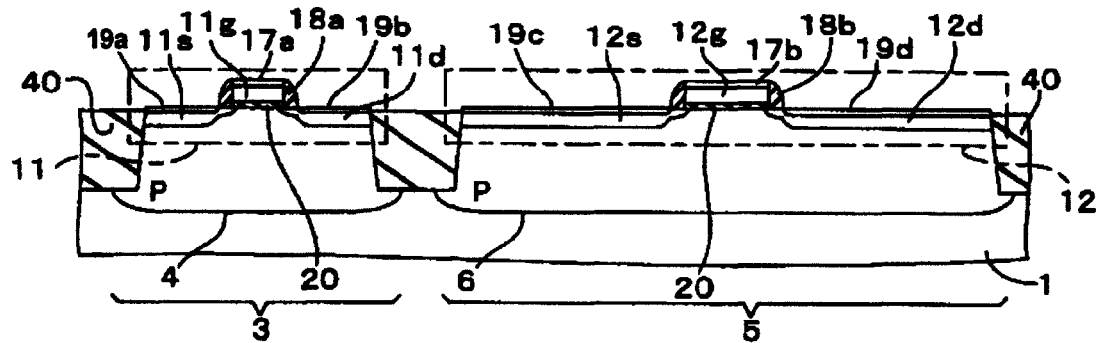
FIGS. 13A and 13B are cross-sectional views of the semiconductor device according to the second embodiment.
Figure 13B:
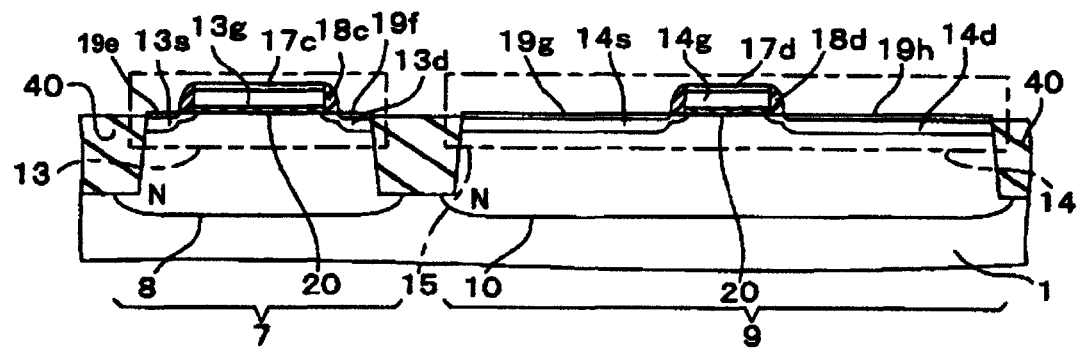

FIG. 12 is a plan view of a semiconductor device according to a second embodiment. FIGS. 13A and 13B are cross-sectional views of the semiconductor device, taken along the lines I-I and II-II in FIG. 12, respectively. In FIG. 12 and FIGS. 13A and 13B, the same reference numerals as in FIG. 1 and FIGS. 2A and 2B denote the same components.

In FIG. 12 and FIGS. 13A and 13B, an STI structure 40 is formed in a device isolation region on a silicon substrate 1. Unlike the STI structure 2 in the first embodiment, the STI structure 40 has a surface lower than the surface of the silicon substrate 1, thus forming a recessed portion relative to first to fourth active regions 3, 5, 7, and 9. In other words, the surfaces of the first to fourth active regions 3, 5, 7, and 9 on the silicon substrate 1 are higher than the surface of the STI structure 40.

As in the first embodiment, a first and second N-type MOSFETs 11 and 12 are formed in the first and second active regions 3 and 5, respectively, and a first and second P-type MOSFETs 13 and 14 are formed in the third and fourth active regions 7 and 9, respectively, on the silicon substrate 1.

The left and right SD widths of a first gate electrode 11g in the first active region 3 are smaller than the left and right SD widths of a second gate electrode 12g in the second active region 5. As in the first embodiment, the gate length $L_a$ of the first gate electrode 11g is smaller than the gate lengths $L_b$ and $L_c$ of the second and third gate electrodes 12g and 13g.

The left and right SD widths of the third gate electrode 13g in the third active region 7 are smaller than the left and right SD widths of a fourth gate electrode 14g in the fourth active region 9. Thus, as in the first embodiment, the gate length $L_c$ of the third gate electrode 13g is larger than the gate length $L_b$ of the fourth gate electrode 14g.

An exposure mask for use in the formation of the first to fourth gate electrodes 11g, 12g, 13g, and 14g is produced by the same process as illustrated in FIG. 3 except for gate length correction by OPC. This correction results from the difference in height between the STI structure 40 and the first to fourth active regions 3, 5, 7, and 9.

The correction of the gate length will be described below, together with a process for forming the first and second N-type MOSFETs 11 and 12 and the first and second P-type MOSFETs 13 and 14.

FIGS. 14A to 14D are cross-sectional views illustrating a process for forming a MOSFET, taken along the line III-III in FIG. 12.

Figure 14A:
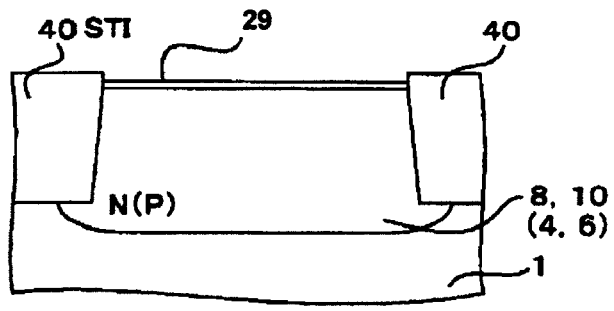
FIGS. 14A-14D are cross-sectional views illustrating a process for forming the semiconductor device according to the second embodiment.

As illustrated in FIG. 14A, a trench 1a, an STI structure 40, P-wells 4 and 6, and N-wells 8 and 10 are formed on a silicon substrate 1 as in the first embodiment.

Figure 14B:
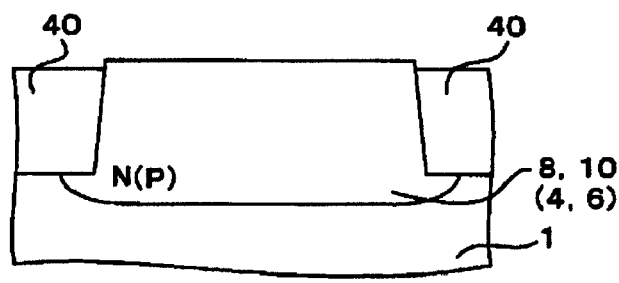

As illustrated in FIG. 14B, a sacrificial oxide layer 29 used in the formation of the wells is removed with a hydrogen fluoride solution. Silicon oxide of the STI structure 40 is also partly etched with the hydrogen fluoride solution. The amount of removed STI structure 40 may be controlled by the concentration of hydrogen fluoride or the treatment time. The STI structure 40 is partly removed to have a surface lower than the surface of the silicon substrate 1 by about 20 nm.

The difference in height between the surface of the STI structure 40 and the surface of the silicon substrate 1 may be controlled by not only the removal of the sacrificial oxide layer 29, a sacrificial oxide layer 29a, and a $SiO_2$ layer 25, but also the adjustment of the thickness of a silicon nitride ($Si_3N_4$) layer 26, the adjustment of the CMP quantity in the formation of an STI structure, and the adjustment of the APM treatment time in the removal of a photoresist.

Figure 14C:
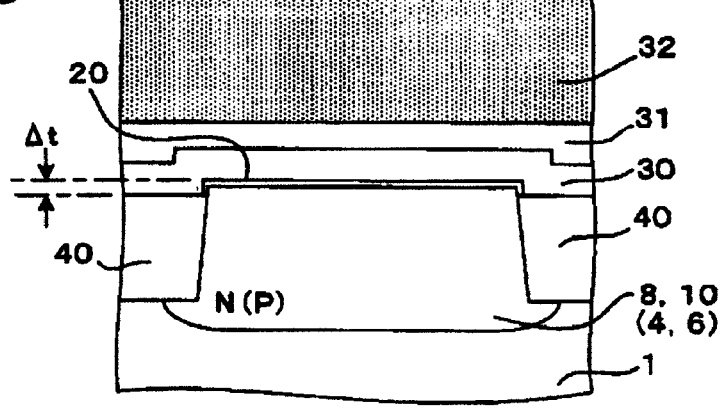

As illustrated in FIG. 14C, after a gate oxide 20 is formed on the silicon substrate 1 by thermal oxidation, a polysilicon layer 30 having a thickness of 105 nm is formed. A BARC layer 31 having a thickness of 75 nm and a photoresist layer 32 are sequentially formed on the polysilicon layer 30. The photoresist layer 32 is formed of a positive organic material. The polysilicon layer 30 is subsequently doped with a p-type or n-type impurity by ion implantation to form an electroconductive layer.

Because the polysilicon layer 30 is formed by CVD and has a uniform thickness, the difference in height between the surface of the STI structure 40 and the surface of the silicon substrate 1 remains on the surface of the polysilicon layer 30.

The BARC layer 31 is formed of a viscous organic material. Thus, the BARC layer 31 has a substantially flat surface. In other words, the BARC layer 31 has an uneven thickness distribution due to the difference in height between the STI structure 40 and the first to fourth active regions 3, 5, 7, and 9. The thickness of the BARC layer 31 on the first to fourth active regions 3, 5, 7, and 9 is 75 nm to prevent light reflection from the first to fourth active regions 3, 5, 7, and 9.

Since the BARC layer 31 on the STI structure 40 has a thickness larger than a predetermined thickness, its antireflection function is reduced on the STI structure 40. When the positive photoresist layer 32 is exposed using an exposure mask, therefore, the reflected wave is increased on the STI structure 40. Exposure light reflected from the STI structure 40 increases the exposure of the periphery of the first to fourth active regions 3, 5, 7, and 9. In particular, in the first and third active regions 3 and 7 having a small SD width, an increase in light reflection in the surrounding area increases the exposure of the midsection of the active regions corresponding to the gate electrode, thus reducing the gate length.

Thus, an increase in reflected wave may be positively utilized to reduce the gate length without correcting the design gate length.

Figure 15:
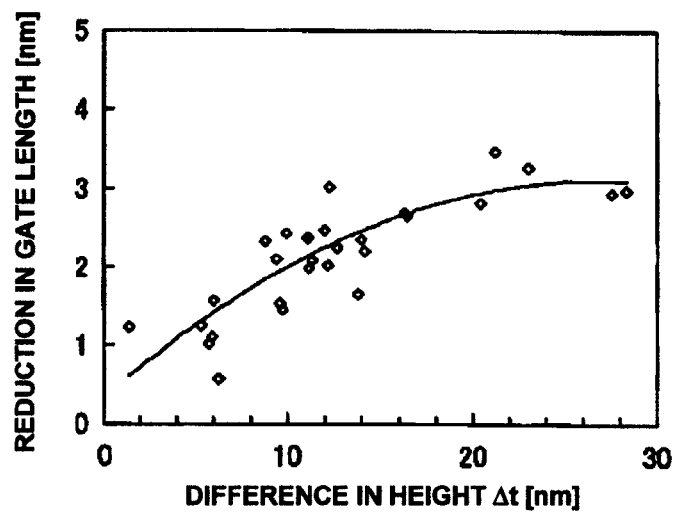
FIG. 15 is a graph illustrating the reduction in gate length as a function of the difference in height between an active region and its surroundings in the semiconductor device according to the second embodiment.

FIG. 15 illustrates the reduction in gate length as a function of the difference in height $\Delta t$ between the surface of the STI structure 40 and the surface of the gate oxide 20, as illustrated in FIG. 14C. FIG. 15 illustrates that the reduction in gate length increases as the difference in height $\Delta t$ increases.

Unlike the first embodiment in which the gate length of the first gate electrode 11g is corrected by OPC, the gate length is reduced by utilizing the difference in height $\Delta t$ illustrated in FIG. 15. In other words, the gate length is corrected by adjusting the difference in height $\Delta t$, as in the relationship between the gate length correction and the SD width, as indicated by the solid line in FIG. 6 in the first embodiment.

For example, FIG. 6 illustrates that, for a design SD width of 0.2 μm, the gate length must be reduced by 2 nm from the design value. FIG. 15 illustrates that, to reduce the gate length by 2 nm from the design value, the STI structure 40 is partly removed so as to give a difference in height $\Delta t$ of about 10 nm. This satisfies the relationship between the on-state current Ion of the first N-type MOSFET and the SD width, as indicated by the solid line in FIG. 4 in the first embodiment.

Even when the STI structure 40 is lowered below the surface of the silicon substrate 1, in the second and fourth gate electrodes 12g and 14g in the second and fourth active regions 5 and 9 having a lager SD width, an increase in exposure light reflected from the STI structure 40 has little effect on the gate length. Reflected light from the periphery of the second and fourth active regions 5 and 9 has an effect only on the periphery of the second and fourth active regions 5 and 9, if any, and has no significant influence on the transistor characteristics.

Figure 17:
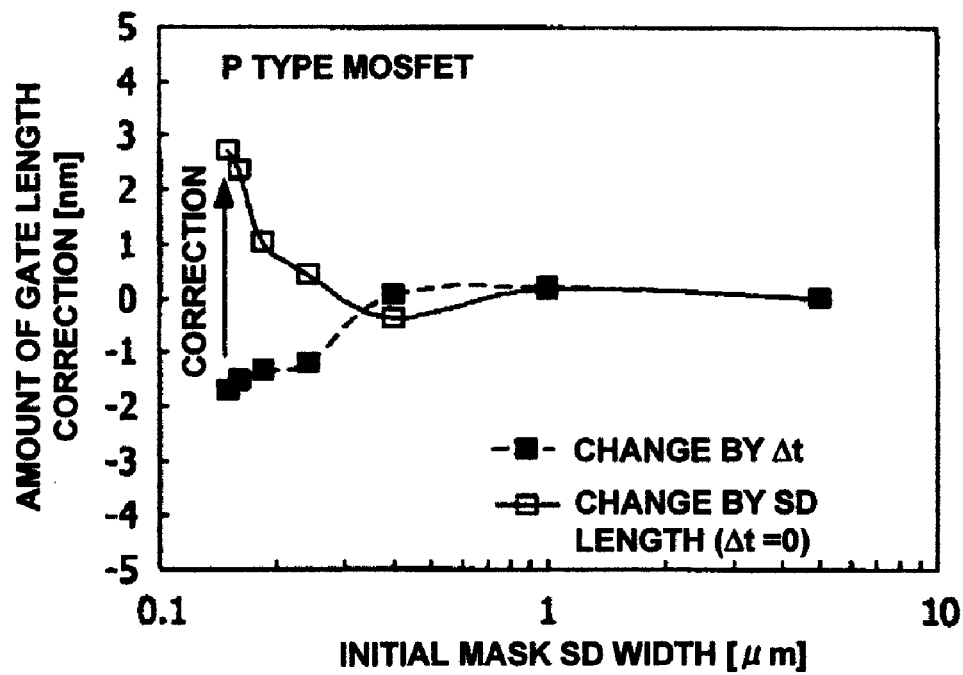
FIG. 17 is a graph illustrating the relationship between the SD width of a P-type MOSFET and the gate length correction in the semiconductor device according to the second embodiment.

In contrast, as indicated by the broken line in FIG. 17, when the gate length of the first P-type MOSFET 13 in the third active region 7 having a small SD width is not treated by OPC in relation to the SD width, the gate length decreases as decreasing SD width because of the effect of the difference in height $\Delta t$. Consequently, as indicated by the broken line in FIG. 18, the on-state current of the first P-type MOSFET 13 increases at an SD width of 0.4 μm or less and exceeds 120% at an SD width of 0.2 μm or less.

Figure 16A:
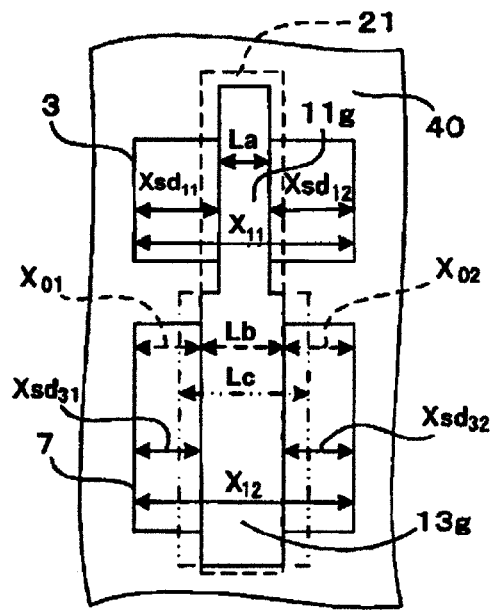
FIGS. 16A and 16B are plan views of a gate electrode in the semiconductor device according to the second embodiment before and after correction, respectively.
Figure 16B:
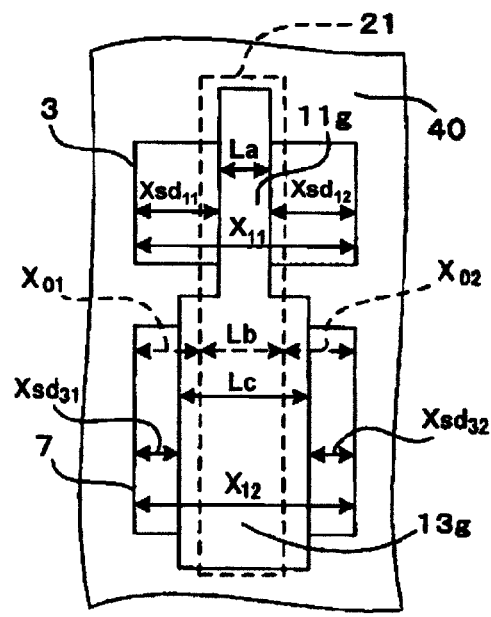
Figure 18:
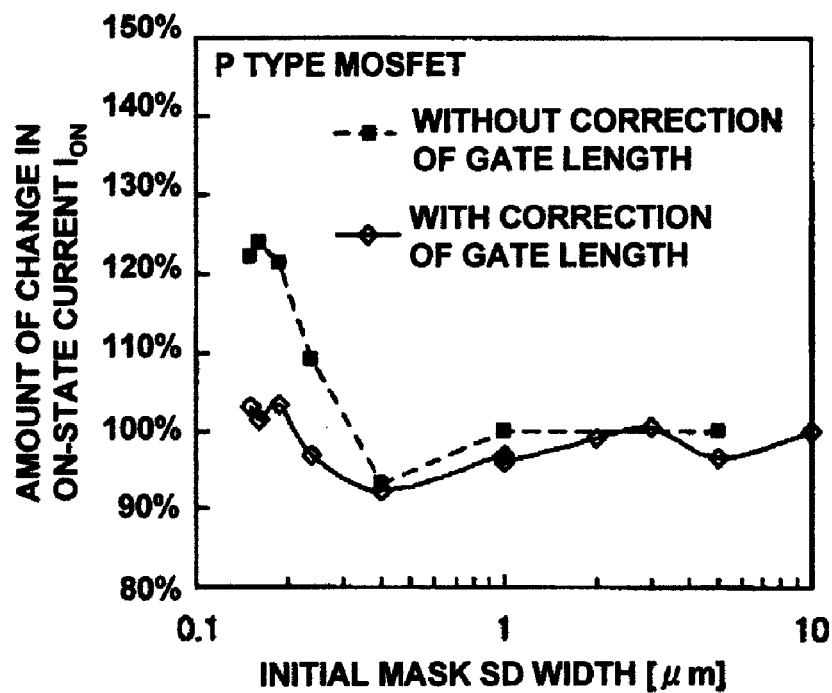
FIG. 18 is a graph illustrating the relationship between the SD width of a P-type MOSFET and the on-state current in the semiconductor device according to the second embodiment.

As for the gate length of the P-type MOSFET, in addition to the gate length correction by OPC in the first embodiment, the reduction in gate length caused by the difference in height $\Delta t$ must be corrected. After correction of the difference between the solid line and the broken line indicated by the arrow in FIG. 17 is made on the design value in OPC in FIG. 3, the on-state current curve indicated by the solid line in FIG. 18 is obtained. Thus, as illustrated in FIG. 16B, the actually formed third gate electrode 13g has the same gate length as in the first embodiment.

A specific example of gate length correction is described below.

When a right or left design SD width of a gate electrode in one active region is 0.17 μm or less (SD width≦0.17 μm), the lengths of a right and left halves of the gate electrode in a P-type MOSFET are individually increased by 3.0 nm (6.0 nm in total) from the design value by the OPC of mask data. The gate length in an N-type MOSFET is decreased by 3.0 nm in total on both sides by adjusting the difference in height $\Delta t$ of an STI structure without performing OPC.

When a right and left design SD widths of a gate electrode in one active region are more than 0.17 μm and at least one of the SD widths is not more than 0.20 μm (0.20 μm≧SD width>0.17 μm), the lengths of a right and left halves of the gate electrode in a P-type MOSFET are individually increased by 2.0 nm (4.0 nm in total) from the design value by the OPC of mask data. The gate length in an N-type MOSFET is decreased by 3.0 nm by adjusting the difference in height Δt of an STI structure without performing OPC.

When a right and left design SD widths of a gate electrode in one active region are more than 0.20 μm and at least one of the SD widths is not more than 0.23 μm (0.23 μm≧SD width>0.20 μm), the lengths of a right and left halves of the gate electrode in a P-type MOSFET are individually increased by 1.0 nm (2.0 nm in total) from the design value by the OPC of mask data. The gate length in an N-type MOSFET is decreased by 2.0 nm by adjusting the difference in height Δt of an STI structure without performing OPC.

When a right and left design SD widths of a gate electrode in one active region are more than 0.23 μm and at least one of the SD widths is not more than 0.30 μm (0.30 μm≧SD width>0.23 μm), the lengths of a right and left halves of the gate electrode in a P-type MOSFET are individually increased by 0.5 nm (1.0 nm in total) from the design value by the OPC of mask data. The gate length in an N-type MOSFET is decreased by 1.0 nm by adjusting the difference in height Δt of an STI structure without performing OPC.

The photoresist layer 32 in FIG. 14C is exposed using an exposure mask or reticle produced on the basis of data including such a corrected design gate length, and is developed to form a photoresist pattern having a gate electrode shape.

The BARC layer 31 and the polysilicon layer 30 are etched using the photoresist pattern as a mask. The patterned polysilicon layer 30 is used as first to fourth gate electrodes 11g, 12g, 13g, and 14g.

Figure 14D:
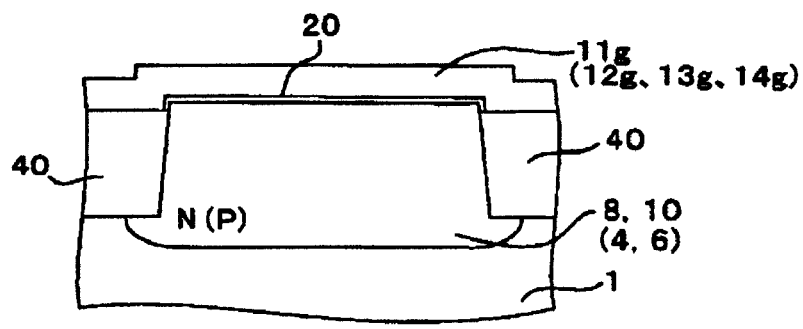

As illustrated in FIG. 14D, the BARC layer 31 and the photoresist layer 32 are removed to expose the first to fourth gate electrodes 11g, 12g, 13g, and 14g. Source/drain regions, sidewalls, and metal silicide layers are formed as in the first embodiment. Through these operations, the first and second N-type MOSFETs 11 and 12 illustrated in FIG. 13A and the first and second P-type MOSFETs 13 and 14 illustrated in FIG. 13B are completed.

Figure 19:
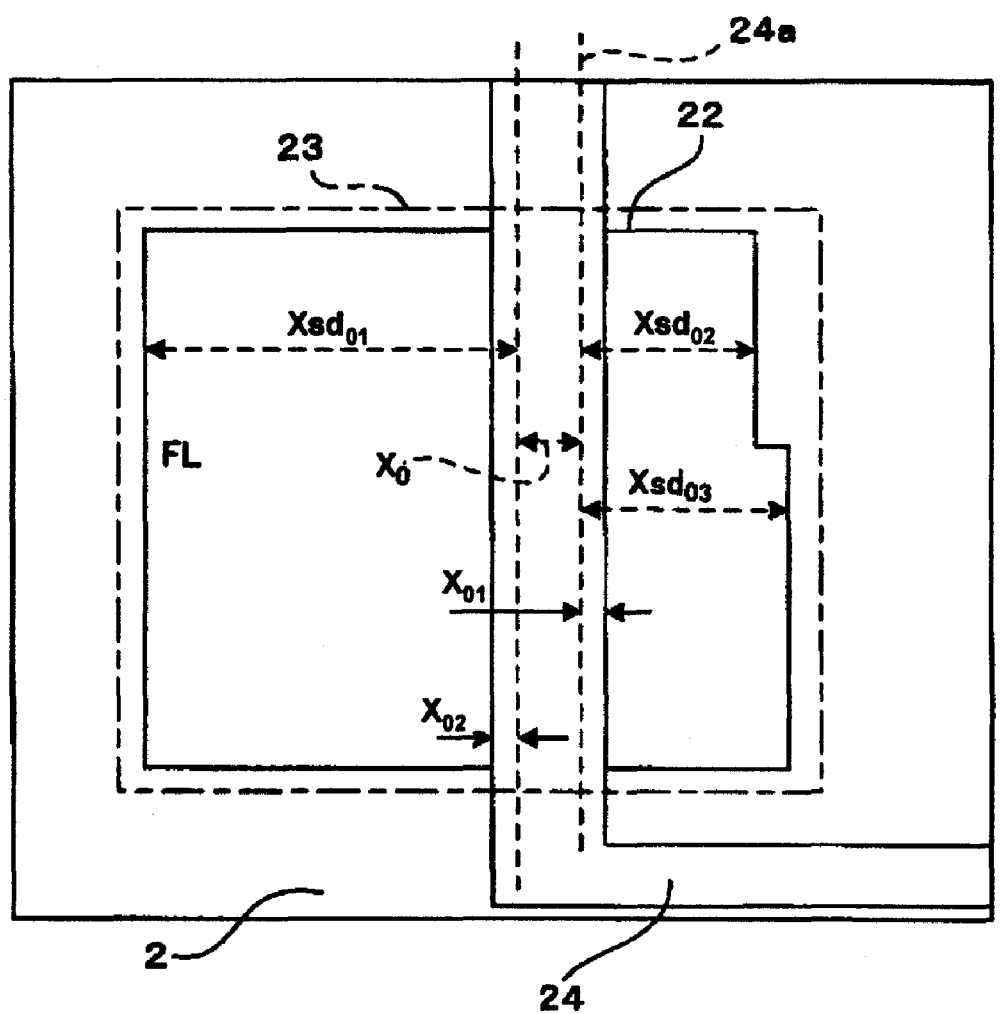
FIG. 19 is a plan view illustrating an exemplary gate length correction of a P-type MOSFET in the semiconductor device according to the second embodiment.

As illustrated in FIG. 19, a right and left SD width of a P-type MOSFET in one active region may be different in a design layout. In FIG. 19, the same reference numerals as in FIG. 8 denote the same components.

In a design gate electrode 24a indicated by the broken line, a left design SD width $Xsd_{01}$ is larger than right design SD widths $Xsd_{02}$ and $Xsd_{03}$, which are not identical. More specifically, the left design SD width $Xsd_{01}$ is 0.4 μm, and the right design SD widths $Xsd_{02}$ and $Xsd_{03}$ are 0.16 and 0.18 μm, respectively.

In this case, the gate length may be altered on the basis of the smallest design SD width $Xsd_{02}$. More specifically, in an N-well, when the reduction in gate length due to the difference in height Δt is 0.003 μm in total, additional left and right pattern widths $X_{01}$ and $X_{02}$ of 0.003 μm (0.006 μm in total) are added to a design gate length $L_b$ in accordance with the relationship illustrated in FIG. 17.

As indicated by the solid line in FIG. 18, variations in the on-state current of the P-type MOSFET 23 including the gate electrode 24 thus formed are reduced to 10% of variations observed before correction at an SD width of 0.4 μm or less. This may reduce the difference in on-state current between the P-type MOSFET 23 and another P-type MOSFET having a sufficiently large SD width.

Preferably, a variation in on-state current due to the gate length correction is not more than 10% or 15% of the on-state current of a MOSFET having a sufficiently large SD width. As indicated by the solid line in FIG. 18, the gate length correction may reduce a variation in the on-state current of a P-type MOSFET from 20% to 10% or less of a reference value. An N-type MOSFET may also have the same characteristics as illustrated in FIG. 4 in the first embodiment by the formation of the difference in height Δt.

The difference in height Δt may be controlled by protruding the STI structure from the surface of the silicon substrate 1 or the gate insulating layer.

Figure 20:
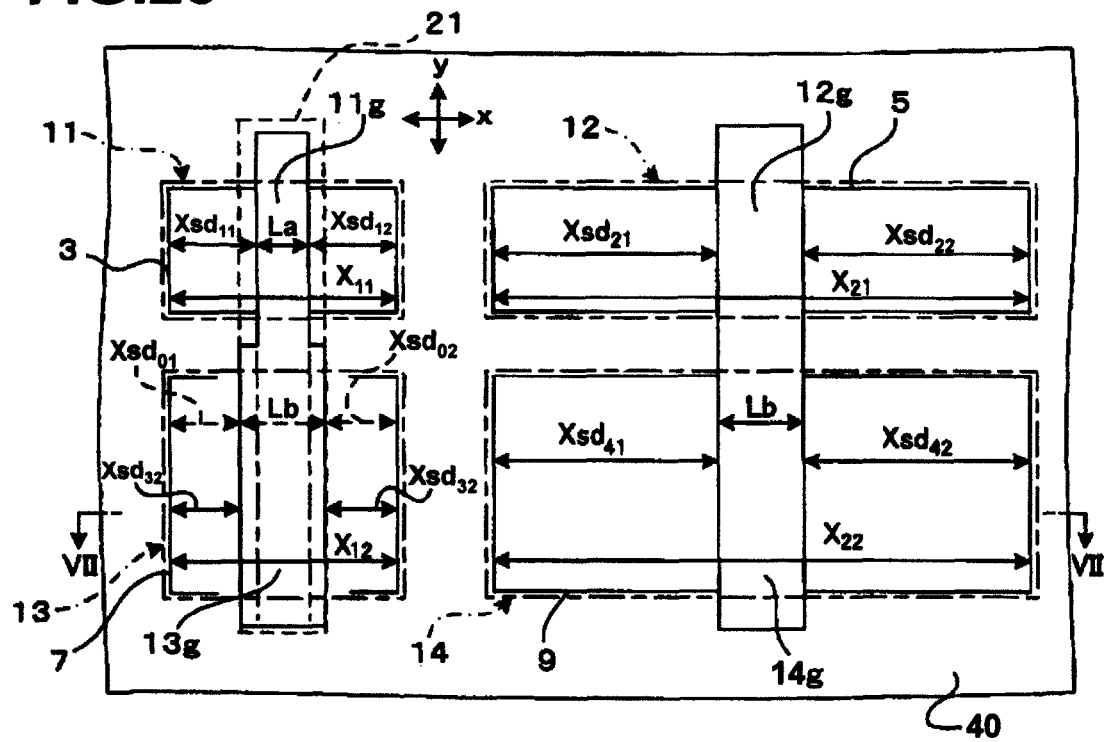
FIG. 20 is a plan view of a semiconductor device according to a third embodiment.
Figure 21:
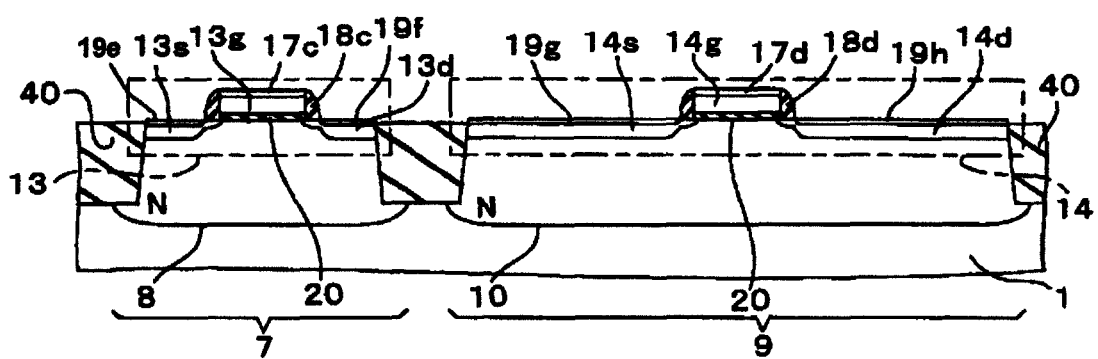
FIG. 21 is a cross-sectional view of the semiconductor device according to the third embodiment.

FIG. 20 is a plan view of a semiconductor device according to a third embodiment. FIG. 21 is a cross-sectional view of the semiconductor device, taken along the line VII-VII in FIG. 20. In FIG. 20 and FIG. 21, the same reference numerals as in FIGS. 12 and 13B denote the same components.

In FIGS. 20 and 21, as in the second embodiment, an STI structure 40 is formed in a device isolation region of a silicon substrate 1. The STI structure 40 has a surface lower than the surface of the silicon substrate 1 or a gate insulating layer, thus forming a recessed portion relative to first to fourth active regions 3, 5, 7, and 9.

As in the second embodiment, a first and second N-type MOSFETs 11 and 12 are formed in the first and second active regions 3 and 5, respectively, and a first and second P-type MOSFETs 13 and 14 are formed in the third and fourth active regions 7 and 9, respectively, on the silicon substrate 1.

The left and right SD widths of a first gate electrode 11g in the first active region 3 are smaller than the left and right SD widths of a second gate electrode 12g in the second active region 5. As in the second embodiment, the gate length $L_a$ of the first gate electrode 11g is smaller than the gate length $L_b$ of the second gate electrode 12g because of the difference in height Δt.

The left and right SD widths of a third gate electrode 13g in the third active region 7 are smaller than the left and right SD widths of a fourth gate electrode 14g in the fourth active region 9. Unlike the second embodiment, the gate length $L_c$ of the third gate electrode 13g is substantially the same as the gate length $L_b$ of the fourth gate electrode 14g ($L_c$=$L_b$).

Figure 22:
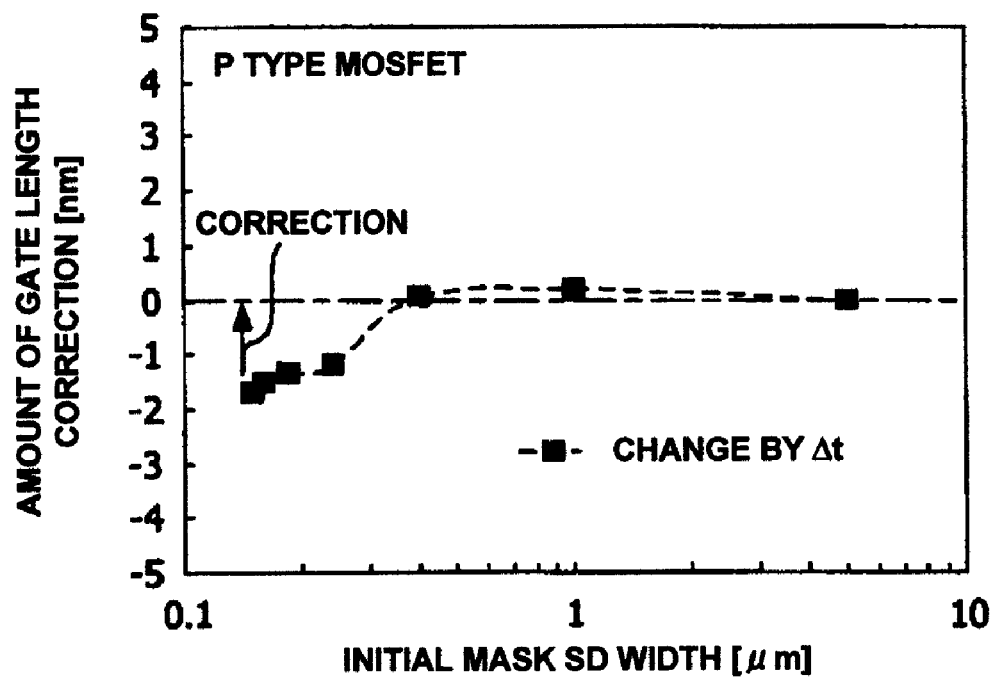
FIG. 22 is a graph illustrating the relationship between the SD width and the variation in gate length due to the height difference in a P-type MOSFET of the semiconductor device according to the third embodiment.

Unlike the second embodiment, data on an exposure mask for use in the formation of the first to fourth gate electrodes 11g, 12g, 13g, and 14g are not subjected to OPC of the gate length in relation to the SD width, and, as illustrated in FIG. 22, only the first P-type MOSFET 13 is corrected by OPC to cancel the reduction in gate length due to the difference in height Δt.

The third gate electrode 13g formed by patterning a polysilicon film by photolithography using such an exposure mask has the same gate length as the fourth gate electrode 14g. The solid line in FIG. 23 illustrates the dependency of the on-state current Ion of the first P-type MOSFET 13 on the SD width.

Figure 23:
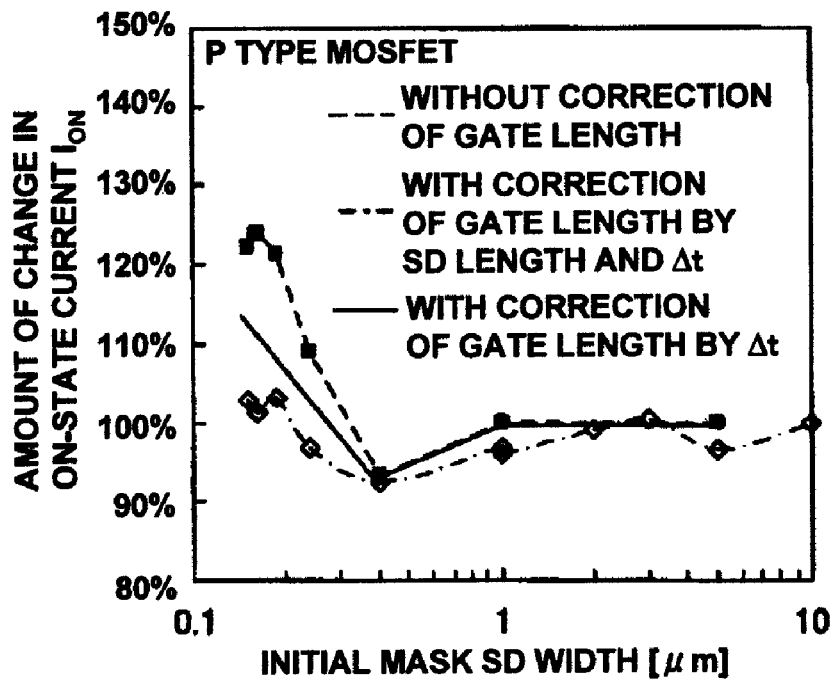
FIG. 23 is a graph illustrating the relationship between the SD width and the on-state current of a P-type MOSFET in the semiconductor device according to the third embodiment.

As illustrated in FIG. 23, the on-state current obtained after the gate length correction to cancel the reduction in gate length due to the difference in height Δt is larger than the on-state current Ion of the first P-type MOSFET 13 in which the gate length is further corrected in relation to the SD width. However, the on-state current obtained after the gate length correction is still lower than the on-state current of a conventional MOSFET in which no correction is performed in relation to the difference in height Δt and the SD width.

As in the second embodiment, the gate length of the first gate electrode 11g in the first N-type MOSFET 11 is not corrected in relation to the SD width but corrected for the difference in height Δt.

Thus, as in the first and second embodiments, the difference in transistor characteristics between a plurality of N-type MOSFETs may be reduced by correcting the gate length of an N-type MOSFET having a narrow source/drain region for the difference in height Δt.

Figure 24:
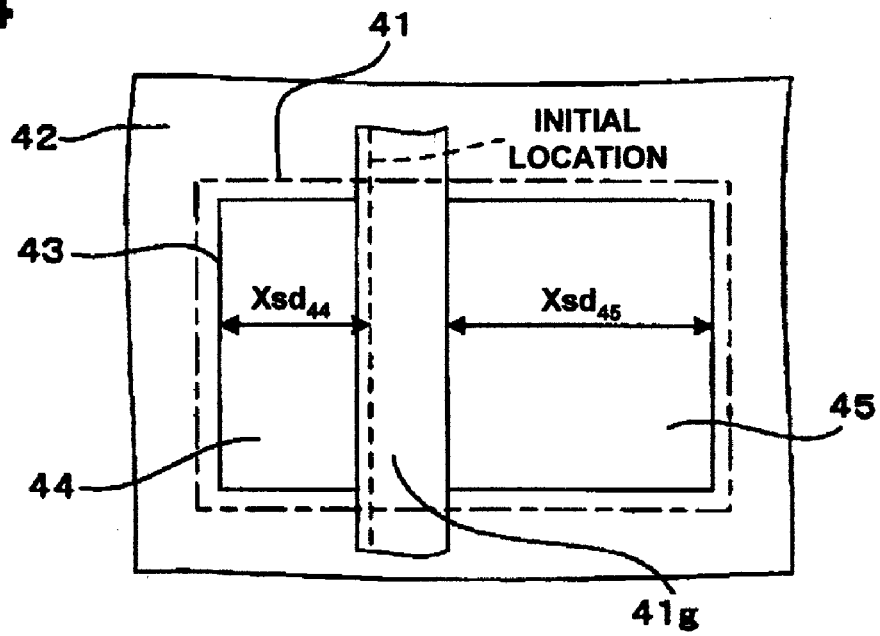
FIG. 24 is a plan view of a semiconductor device according to a fourth embodiment.

FIG. 24 is a plan view of a semiconductor device according to a fourth embodiment.

A MOSFET 41 includes a gate electrode 41g in an active region 43 and source/drain regions 44 and 45 on the left and right sides of the gate electrode 41g. The active region 43 is surrounded by an STI structure 42.

The MOSFET 41 is a first N-type MOSFET 11 or a first P-type MOSFET 13 having a structure, for example, illustrated in FIG. 1 and FIGS. 2A and 2B. The MOSFET 41 further includes sidewalls and a silicide layer (not illustrated).

A right SD width $Xsd_{45}$ of the gate electrode 41g is larger than a left SD width $Xsd_{44}$. As compared with the right SD width $Xsd_{45}$, the left SD width $Xsd_{44}$ significantly affects the transistor characteristics.

Figure 25:
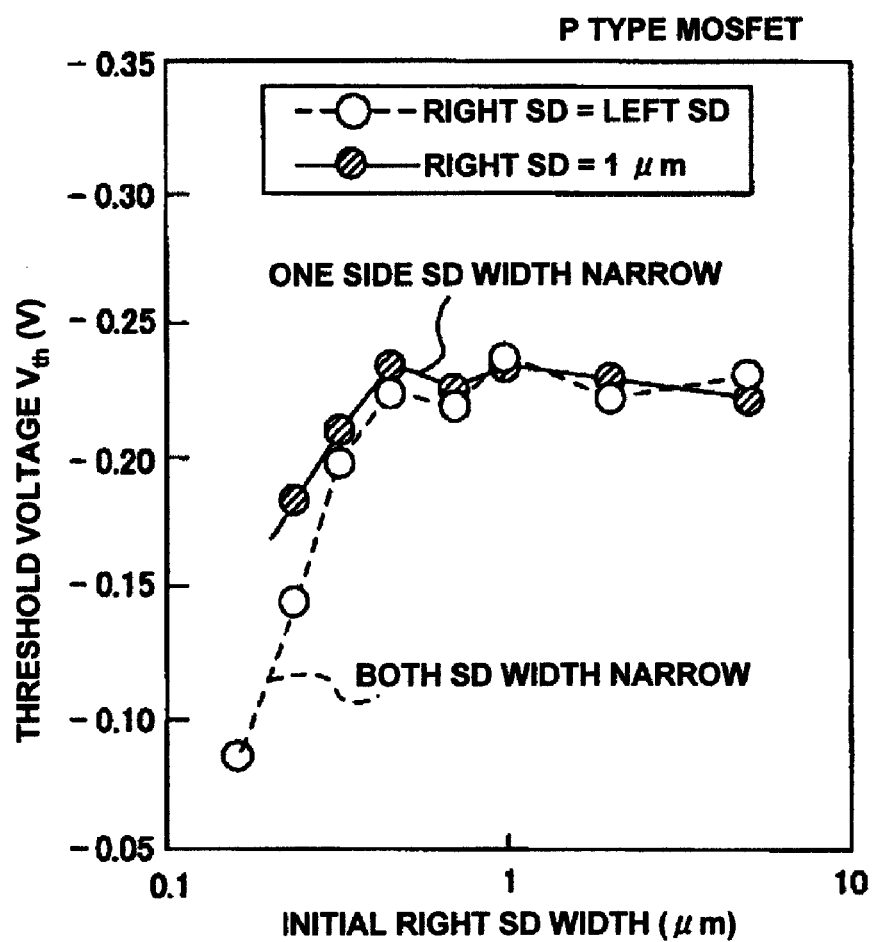
FIG. 25 is a graph illustrating the relationship between the left SD width and the threshold voltage of a P-type MOSFET in the semiconductor device according to the fourth embodiment.

FIG. 25 illustrates the relationship between the left SD width and the threshold voltage of a P-type MOSFET having different left and right design SD widths. The horizontal axis has a logarithmic scale, and the vertical axis has a linear scale.

A P-type MOSFET having a left SD width $Xsd_{44}$ of about 0.2 μm and a right SD width $Xsd_{45}$ of 1 μm has a threshold voltage of about −0.18 V. In contrast, a P-type MOSFET having a left and right SD widths $Xsd_{44}$ and $Xsd_{45}$ of 0.2 μm has a threshold voltage of about −0.14 V.

Since the reduction in threshold voltage is small in a P-type MOSFET having a right or left SD width as large as about 1 μm, at least the length of a half of a gate electrode facing a narrow source/drain region may be altered from the design value to improve the transistor characteristics.

More specifically, as illustrated in FIG. 24, in an N-type or P-type MOSFET having different left and right design SD widths $Xsd_{44}$ and $Xsd_{45}$, at least the length of a half of the gate electrode 41g facing the narrow source/drain region 44 may be increased or decreased to reduce variations in transistor characteristics.

As described in the first, second, and third embodiments, the gate length may be altered by correcting the gate length in accordance with the design SD width, by controlling the difference in height between an STI structure and an active region, or by a combination thereof.

An example of an increase or decrease in the length of a half of a gate electrode is described below.

When the design SD width on one side of a gate electrode in one active region is 0.17 μm or less (SD width≦0.17 μm), the gate length of the gate electrode in a P-type MOSFET is increased toward the smaller design SD width side by 3.0 nm from the design value. The gate length of the gate electrode in an N-type MOSFET is reduced in such a manner that depends on the SD width.

When the design SD width on one side of a gate electrode in one active region is more than 0.17 μm but not more than 0.20 μm (0.20 μm≧SD width>0.17 μm), the gate length of the gate electrode in a P-type MOSFET is increased toward the smaller design SD width side by 2.0 nm from the design value. The gate length of the gate electrode in an N-type MOSFET is reduced in such a manner that depends on the SD width.

When the design SD width on one side of a gate electrode in one active region is more than 0.20 μm but not more than 0.23 μm (0.23 μm≧SD width>0.20 μm), the gate length of the gate electrode in a P-type MOSFET is increased toward the smaller design SD width side by 1.0 nm from the design value. The gate length of the gate electrode in an N-type MOSFET is reduced in such a manner that depends on the SD width.

When the design SD width on one side of a gate electrode in one active region is more than 0.23 μm but not more than 0.30 μm (0.30 μm≧SD width>0.23 μm), the gate length of the gate electrode in a P-type MOSFET is increased toward the smaller design SD width side by 0.5 nm from the design value. The gate length of the gate electrode in an N-type MOSFET is reduced in such a manner that depends on the SD width.

As in the first and second embodiments, a photoresist layer is exposed using an exposure mask or reticle produced on the basis of data including such a corrected design gate length, and is developed to form a resist pattern having a gate electrode shape.

Figure 26:
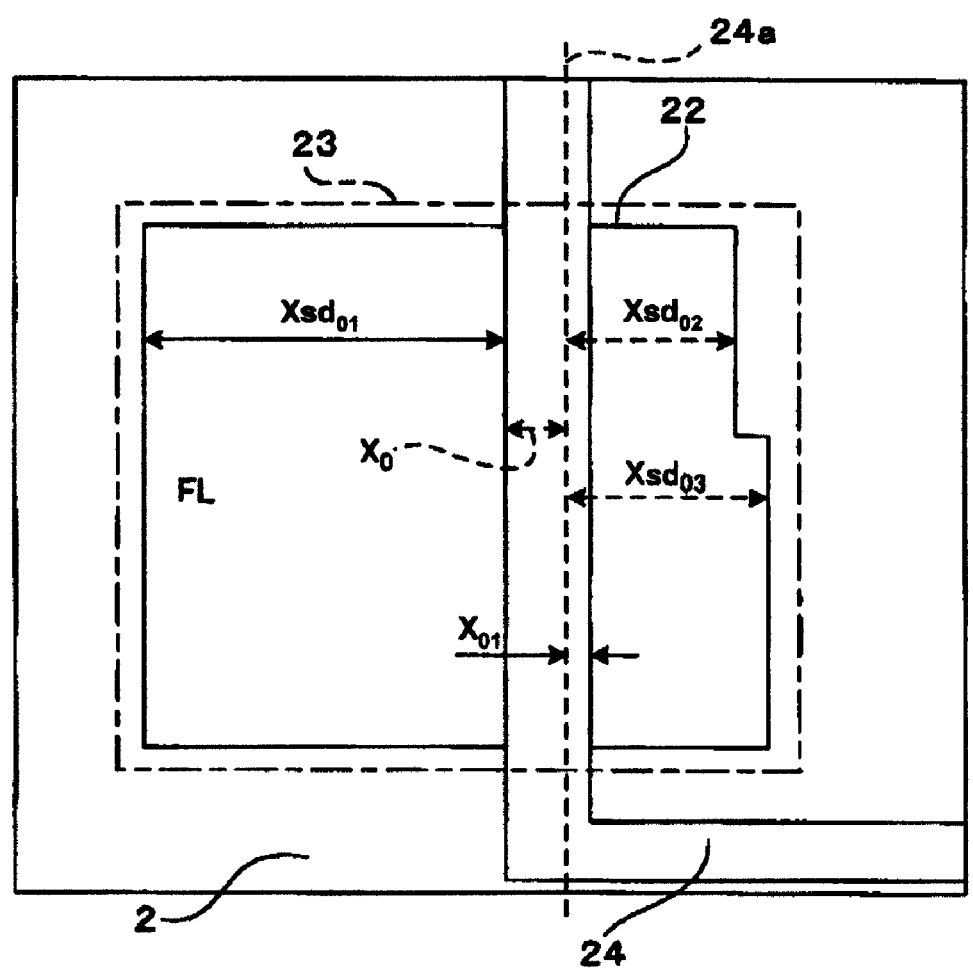
FIG. 26 is a plan view illustrating a first exemplary gate length correction of a P-type MOSFET in the semiconductor device according to the fourth embodiment.
Figure 27:
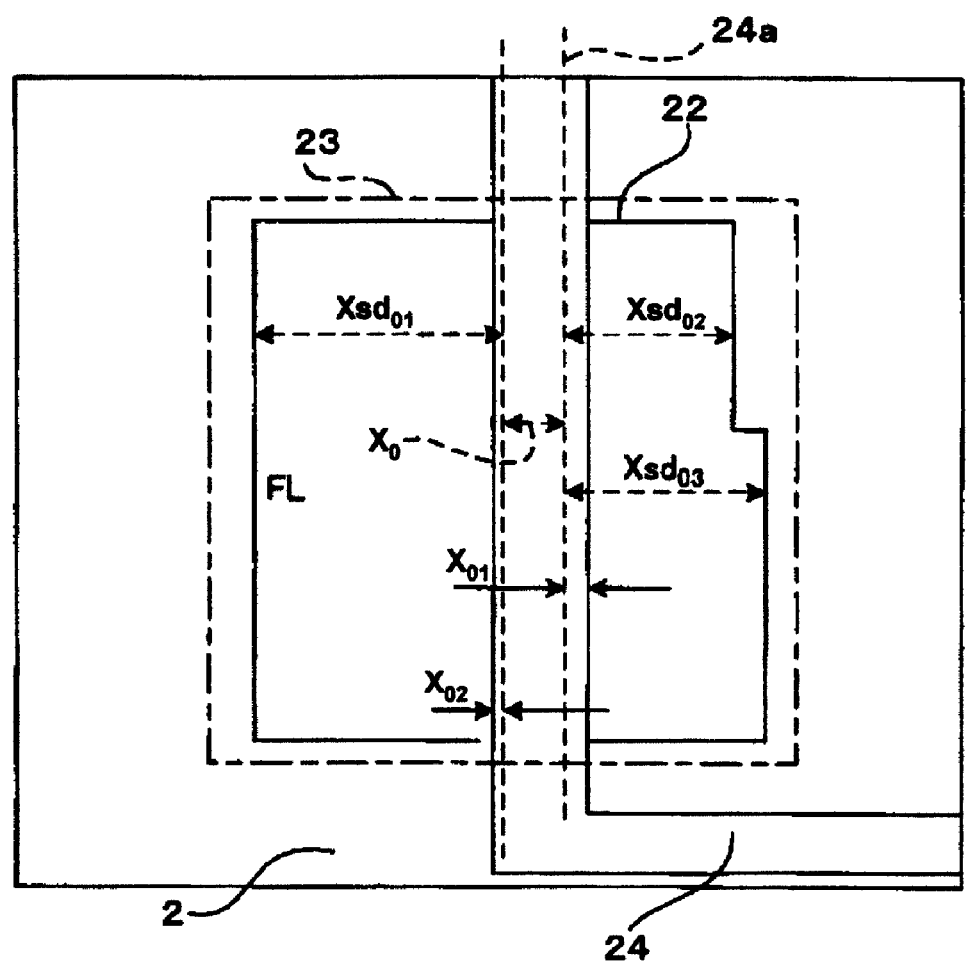
FIG. 27 is a plan view illustrating a second exemplary gate length correction of a P-type MOSFET in the semiconductor device according to the fourth embodiment.
Figure 28:
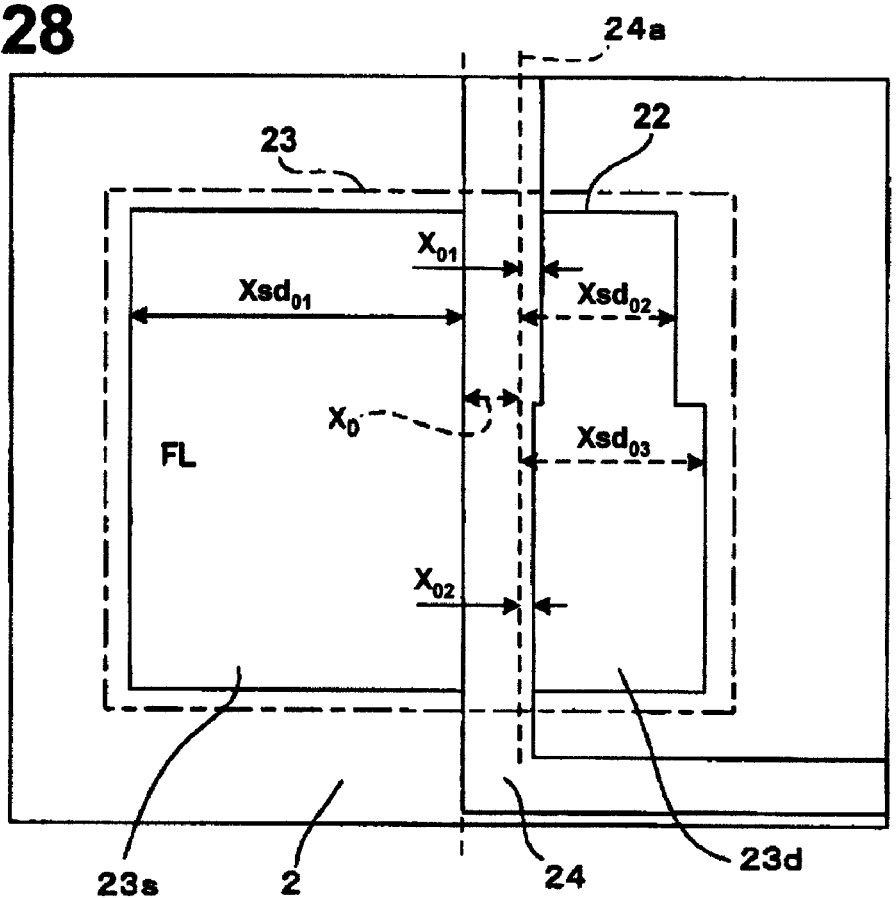
FIG. 28 is a plan view illustrating a third exemplary gate length correction of a P-type MOSFET in the semiconductor device according to the fourth embodiment.

An example of gate length correction will be described below with reference to FIG. 26 to FIG. 28. In FIG. 26 to FIG. 28, the same reference numerals as in FIG. 8 denote the same components.

In a P-type MOSFET 23 in FIG. 26, the left design SD width $Xsd_{01}$ is relatively large, 0.4 μm, and the right design SD widths $Xsd_{02}$ and $Xsd_{03}$ are as small as 0.16 and 0.18 μm, respectively. The gate length of a design gate electrode 24a is increased to the right by 0.003 μm on the basis of the smallest right SD width $Xsd_{02}$ by OPC in relation to the SD width and/or the difference in height Δt.

In a P-type MOSFET 23 in FIG. 27, the left design SD width $Xsd_{01}$ is as small as 0.23 μm, and the right design SD widths $Xsd_{02}$ and $Xsd_{03}$ are as small as 0.16 and 0.18 μm, respectively. The gate length of a design gate electrode 24a is increased to the right by 0.003 μm on the basis of the smallest right SD width $Xsd_{02}$ and to the left by 0.001 μm on the basis of the left SD width $Xsd_{01}$ by OPC in relation to the SD width and/or the difference in height Δt.

In a P-type MOSFET 23 in FIG. 28, the left design SD width $Xsd_{01}$ is relatively large, 0.4 μm, and the right design SD widths $Xsd_{02}$ and $Xsd_{03}$ are as small as 0.16 and 0.18 μm, respectively. The gate length of a design gate electrode 24a is increased to the right by 0.003 μm in a region having the right SD width $Xsd_{02}$ and by 0.002 μm in a region having the right SD width $Xsd_{03}$ by OPC in relation to the SD width and/or the difference in height Δt.

Thus, when a source/drain region adjacent to one side of a gate electrode has different SD widths, the gate length may be altered in such a manner that depends on the SD width to improve transistor characteristics.

As in the first, second, and third embodiments, the difference in transistor characteristics between a plurality of MOSFETs may be reduced by correcting the gate length of a MOSFET having a narrow source/drain region.

Figure 29:
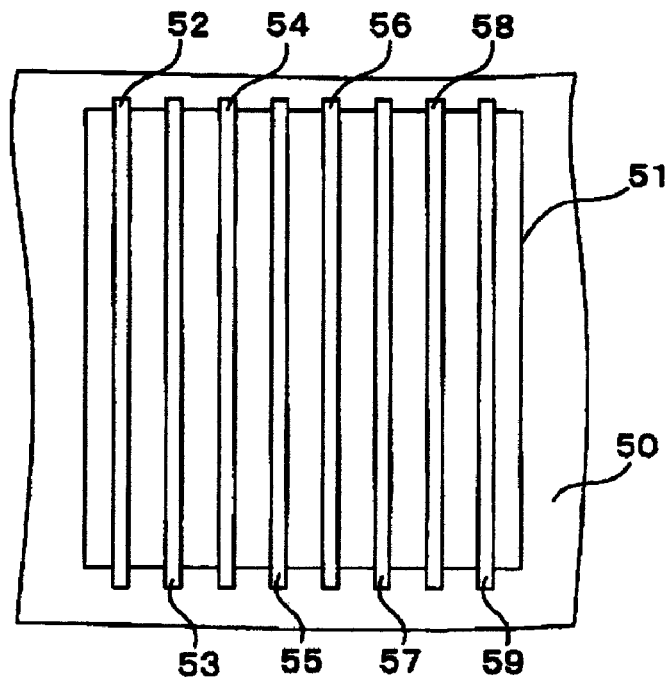
FIG. 29 is a plan view of a semiconductor device according to a fifth embodiment.
Figure 30A:
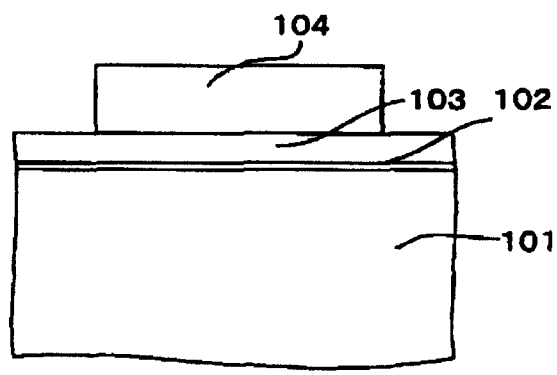
FIGS. 30A-30D are cross-sectional views illustrating a process for forming a semiconductor device according to a related art.
Figure 30B:
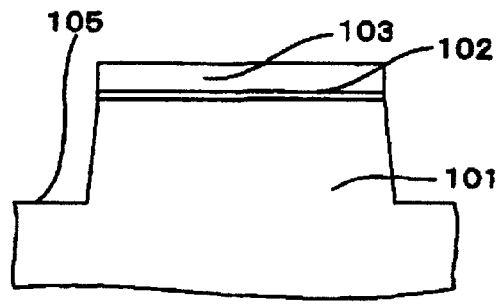
Figure 30C:
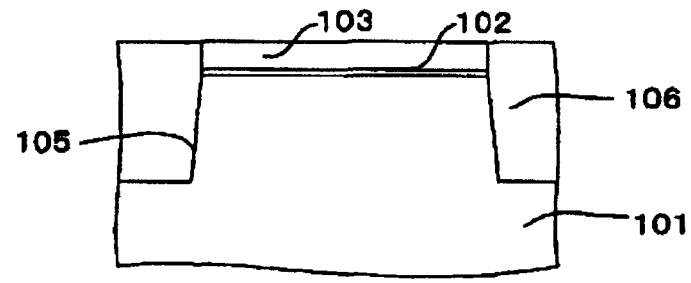
Figure 30D:
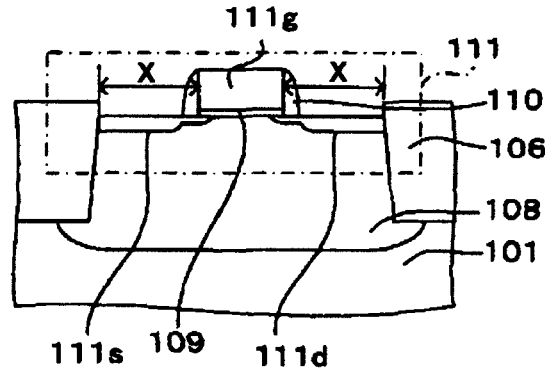

FIG. 29 is a plan view of a semiconductor device according to a fifth embodiment.

In a structure including a plurality of MOSFETs in a single active region 51 surrounded by an STI structure 50, the design gate lengths of gate electrodes 52 to 59 are individually modified on the basis of the SD width. The left SD width refers to the distance between the left side of the active region 51 and the left side of a gate electrode 52, 53, 54, 55, 56, 57, 58, or 59 that is a target of gate length correction. The right SD width refers to the distance between the right side of the active region 51 and the right side of the target gate electrode. The gate electrodes 52 to 59 have different left and right SD widths.

The gate lengths of the middle gate electrodes 55 and 56 are larger than the gate lengths of the leftmost and rightmost gate electrodes 52 and 59 in an N-type MOSFET, and are smaller than the gate lengths of the leftmost and rightmost gate electrodes 52 and 59 in a P-type MOSFET. The correction of the gate length is performed as in the first to fourth embodiments. When a single active region includes two gate electrodes, the gate length correction is performed on the basis of the left or right SD width of each gate electrode.

In the first to fifth embodiments, the width of an electroconductive pattern in the x direction outside an active region may not be corrected in relation to the SD width. The STI structure in the device isolation region described above may be a structure formed by local oxidation of silicon (LOCOS).

These embodiments are provided only by way of typical examples. Those skilled in the art will recognize that combinations, modifications, and variations of the components may be made in the embodiments without departing from the spirit and scope of the present technique.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modification and equivalents may be resorted to, falling within the scope thereof.

What is claimed is:

1. A semiconductor device comprising:
   a first and a second active regions of a first conductivity type disposed on a semiconductor substrate;
   a third and a fourth active regions of a second conductivity type disposed on the semiconductor substrate, the second and the fourth active regions having sizes larger than those of the first and the third active regions respectively;
   a first electroconductive pattern disposed over the first active region and having a first width;
   a second electroconductive pattern disposed over the second active region and having a second width larger than the first width;
   a third electroconductive pattern disposed over the third active region and having a third width; and
   a fourth electroconductive pattern disposed over the fourth active region and having a fourth width smaller than the third width, wherein
   the first electroconductive pattern is electrically connected to the third electroconductive pattern,
   the second electroconductive pattern is electrically connected to the fourth electroconductive pattern, and
   the second width is the same as the fourth width.

2. The semiconductor device according to claim 1, wherein a distance between one end of the first active region and one sidewall of the first electroconductive pattern is smaller than a distance between one end of the second active region and one sidewall of the second electroconductive pattern, and a distance between one end of the third active region and one sidewall of the third electroconductive pattern is smaller than a distance between one end of the fourth active region and one sidewall of the fourth electroconductive pattern.

3. The semiconductor device according to claim 1, wherein the third width is larger than the first width.

4. The semiconductor device according to claim 1, wherein the first active region, the second active region, the third active region, and the fourth active region are individually surrounded by a device isolation region on the semiconductor substrate.

5. The semiconductor device according to claim 4, wherein a trench is in the device isolation region and an insulating layer is embedded in the trench.

6. The semiconductor device according to claim 5, wherein the top surfaces of the first active region, the second active region, the third active region, and the fourth active region are higher than the top surface of the insulating layer.

7. The semiconductor device according to claim 1, wherein the first electroconductive pattern is a first gate electrode of a first transistor of a first conductivity type, the second electroconductive pattern is a second gate electrode of a second transistor of the first conductivity type, the third electroconductive pattern is a third gate electrode of a third transistor of a second conductivity type, and the fourth electroconductive pattern is a fourth gate electrode of a fourth transistor of the second conductivity type.

8. The semiconductor device according to claim 7, wherein a first source/drain region of the first transistor formed in the first active region has a same impurity depth profile as a second source/drain region of the second transistor formed in the second active region, and a third source/drain region of the third transistor formed in the third active region has a same impurity depth profile as a fourth source/drain region of the fourth transistor formed in the fourth active region.

9. A semiconductor device comprising:
   a first and a second active regions of a first conductivity type disposed on a semiconductor substrate;
   a third and a fourth active regions of a second conductivity type disposed on the semiconductor substrate, the second and the fourth active regions having sizes larger than those of the first and the third active regions respectively;
   a first electroconductive pattern disposed over the first active region and having a first width;
   a second electroconductive pattern disposed over the second active region and having a second width larger than the first width;
   a third electroconductive pattern disposed over the third active region and having a third width; and
   a fourth electroconductive pattern disposed over the fourth active region and having a fourth width smaller than the third width, wherein
   the first electroconductive pattern is a first gate electrode of a first transistor of a first conductivity type,
   the second electroconductive pattern is a second gate electrode of a second transistor of the first conductivity type,
   the third electroconductive pattern is a third gate electrode of a third transistor of a second conductivity type,
   the fourth electroconductive pattern is a fourth gate electrode of a fourth transistor of the second conductivity type, and
   gate insulating layers formed between the semiconductor substrate and the first gate electrode, the second gate electrode, the third gate electrode, and fourth gate electrode have the same thickness.

* * * * *